(12) United States Patent
Bharitkar

(10) Patent No.: US 11,176,958 B2
(45) Date of Patent: Nov. 16, 2021

(54) LOUDNESS ENHANCEMENT BASED ON MULTIBAND RANGE COMPRESSION

(71) Applicant: Hewlett-Packard Development Company, L.P., Spring, TX (US)

(72) Inventor: Sunil Bharitkar, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 78 days.

(21) Appl. No.: 16/487,126

(22) PCT Filed: Apr. 28, 2017

(86) PCT No.: PCT/US2017/030181
§ 371 (c)(1),
(2) Date: Aug. 20, 2019

(87) PCT Pub. No.: WO2018/199989
PCT Pub. Date: Nov. 1, 2018

(65) Prior Publication Data
US 2021/0134314 A1 May 6, 2021

(51) Int. Cl.
*G10L 21/034* (2013.01)
*G10L 25/18* (2013.01)
(Continued)

(52) U.S. Cl.
CPC ............ *G10L 21/034* (2013.01); *G10L 25/18* (2013.01); *G10L 25/30* (2013.01); *H03G 3/20* (2013.01)

(58) Field of Classification Search
CPC ....... G10L 21/034; G10L 25/30; G10L 25/18; H03G 3/20; H04R 1/1083; H04R 2430/01;
(Continued)

(56) References Cited

U.S. PATENT DOCUMENTS 5,907,622 A * 5/1999 Dougherty ............... H03G 3/32
381/57
6,097,824 A 8/2000 Lindemann et al.
(Continued)

OTHER PUBLICATIONS

Karelic, Y. et al., "Compression of High-quality Audio Signals Using Adaptive Filterbanks and a Zero-tree Coder", Mar. 7-8, 1995, In Eighteenth Convention of Electrical and Electronics Engineers in Israel, pp. 3-2. IEEE.

*Primary Examiner* — Akelaw Teshale
(74) *Attorney, Agent, or Firm* — Mannava & Kang

(57) ABSTRACT

In some examples, loudness enhancement based on multiband range compression may include determining, based on variations in compression parameters that include compression thresholds and compression ratios, corresponding variations in loudness levels for a specified loudness standard. A learning model may be trained based on the variations in the compression parameters and the corresponding variations in the loudness levels. A specified loudness level for a device may be ascertained, for example, from a user of the device. The compression parameters for the specified loudness level may be determined based on the trained learning model. Further, sub-band compression of an input audio signal may be performed, based on the determined compression parameters, by processing the input audio signal using a perfect reconstruction filterbank.

15 Claims, 31 Drawing Sheets

(51) Int. Cl.
*G10L 25/30* (2013.01)
*H03G 3/20* (2006.01)

(58) Field of Classification Search
CPC .......... H04R 3/04; H04R 25/505; H04R 5/04; H04R 2420/05; G06F 3/165; G06F 16/683
See application file for complete search history.

(56) References Cited

U.S. PATENT DOCUMENTS

| | | | |
|---|---|---|---|
| 7,529,545 B2 * | 5/2009 | Rader | H04R 25/70 455/268 |
| 8,199,933 B2 * | 6/2012 | Seefeldt | H04S 7/00 381/104 |
| 8,548,614 B2 | 10/2013 | Kirkeby et al. | |
| 8,903,109 B2 | 12/2014 | Vickers | |
| 9,258,031 B2 | 2/2016 | Groh | |
| 9,350,312 B1 * | 5/2016 | Wishnick | H03G 3/20 |
| 2004/0267542 A1 | 12/2004 | Mohammed et al. | |
| 2005/0260978 A1 * | 11/2005 | Rader | H04R 25/70 455/418 |
| 2007/0276656 A1 | 11/2007 | Solbach et al. | |
| 2009/0116664 A1 | 5/2009 | Smirnov et al. | |
| 2011/0110533 A1 | 5/2011 | Choi et al. | |
| 2012/0328115 A1 | 12/2012 | Wolters et al. | |
| 2013/0013096 A1 | 1/2013 | Seefeldt | |
| 2015/0243295 A1 * | 8/2015 | Truman | G10L 19/0204 381/94.2 |
| 2015/0381133 A1 * | 12/2015 | Craig | H03G 3/20 381/102 |
| 2016/0189707 A1 * | 6/2016 | Donjon | H04W 88/02 704/205 |
| 2016/0191007 A1 | 6/2016 | Li et al. | |
| 2016/0344356 A1 * | 11/2016 | Grosche | G10L 19/26 |
| 2016/0351202 A1 | 12/2016 | Baumgarte | |

* cited by examiner

1800

ASCERTAIN A SPECIFIED LOUDNESS LEVEL FOR A DEVICE
1802

DETERMINE, BASED ON A TRAINED LEARNING MODEL, COMPRESSION PARAMETERS FOR THE SPECIFIED LOUDNESS LEVEL
1804

PERFORM, BASED ON THE DETERMINED COMPRESSION PARAMETERS, SUB-BAND COMPRESSION OF AN INPUT AUDIO SIGNAL BY PROCESSING THE INPUT AUDIO SIGNAL USING A PERFECT RECONSTRUCTION FILTERBANK
1806

FIG. 18

LOUDNESS ENHANCEMENT BASED ON MULTIBAND RANGE COMPRESSION

BACKGROUND

Devices such as notebooks, desktop computers, mobile telephones, tablets, and other such devices may include speakers or utilize headphones to reproduce sound. The sound emitted from such devices may be subject to various processes that modify the sound quality.

BRIEF DESCRIPTION OF DRAWINGS

Features of the present disclosure are illustrated by way of example and not limited in the following figure(s), in which like numerals indicate like elements, in which:

FIG. 18 illustrates an example flowchart of a method for loudness enhancement based on multiband range compression.

DETAILED DESCRIPTION

Figure 1:
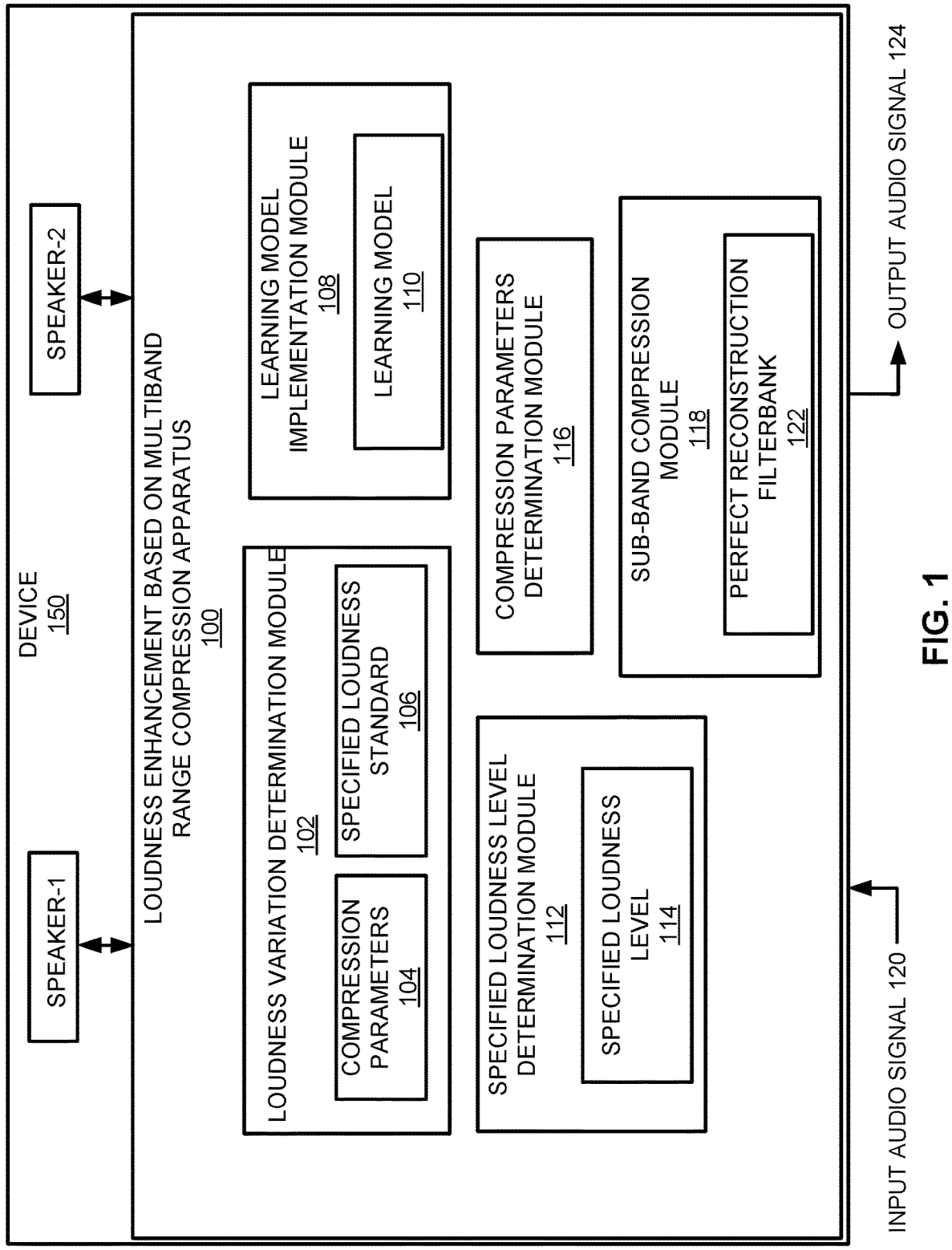
FIG. 1 illustrates an example layout of a loudness enhancement based on multiband range compression apparatus.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Loudness enhancement based on multiband range compression apparatuses, methods for loudness enhancement based on multiband range compression, and non-transitory computer readable media having stored thereon machine readable instructions to provide loudness enhancement based on multiband range compression are disclosed herein. The apparatuses, methods, and non-transitory computer readable media disclosed herein provide for intelligent multiband range compression using perfect reconstruction filterbanks, implementation of standards, such as the International Telecommunication Union (ITU)-R BS.1770 standard for loudness estimation, and neural-network trained parameters to control loudness and thus audio quality (e.g., timbre). Further, the apparatuses, methods, and non-transitory computer readable media disclosed herein provide for enhancement of spatial performance of an immersive audio rendering chain, while overcoming masking by high amplitude front-channel signals over surround channel signals.

With respect to spatial rendering of audio signals, devices such as notebooks, desktop computers, mobile telephones, tablets, and other such devices may include speakers or utilize headphones to reproduce sound. Such devices may utilize a high-quality audio reproduction to create an immersive experience for cinematic and music content. The cinematic content may be multichannel (e.g., 5.1, 7.1, etc., where 5.1 represents "five point one" and includes a six channel surround sound audio system, 7.1 represents "seven point one" and includes an eight channel surround sound audio system, etc.). Elements that contribute towards a high-quality audio experience may include the frequency response (e.g., bass extension) of speakers or drivers, and proper equalization to attain a desired spectral balance. Other elements that contribute towards a high-quality audio experience may include artifact-free loudness processing to accentuate masked signals and improve loudness, and spatial quality that reflects artistic intent for stereo music and multichannel cinematic content.

With respect to spatial rendering with speakers, dynamic range compression may be categorized under either single-frequency band compression or multi-frequency band compression. The single-frequency band compression may be simpler to implement but may include technical challenges with respect to limited control of spectral balance and audio quality. The multi-frequency band compression may present technical challenges with respect to complexity of implementation due to overlapping band-pass filters that may cause artifacts around band-edges during audio resynthesis, but allows for increased control of audio quality through the use of multiple bands.

In order to address at least these technical challenges associated with implementation of single-frequency band compression and multi-frequency band compression, the apparatuses, methods, and non-transitory computer readable media disclosed herein provide loudness enhancement based on multiband range compression. In this regard, the loudness enhancement based on multiband range compression may include implementation of a nested perfect reconstruction filterbank, with multirate processing of an audio signal, to enable sub-band compression to control audio quality, while ensuring that there are no artifacts around band-edges. The parameters with respect to multiband compression processing may be designed by implementing standards, such as the ITU-R BS.1770 technique with a reference pink noise stimuli. Further, interpolation and generalization using machine learning (e.g., neural network) may be implemented to provide extensibility to arbitrary parameter settings.

For the apparatuses, methods, and non-transitory computer readable media disclosed herein, modules, as described herein, may be any combination of hardware and programming to implement the functionalities of the respective modules. In some examples described herein, the combinations of hardware and programming may be implemented in a number of different ways. For example, the programming for the modules may be processor executable instructions stored on a non-transitory machine-readable storage medium and the hardware for the modules may include a processing resource to execute those instructions. In these examples, a computing device implementing such modules may include the machine-readable storage medium storing the instructions and the processing resource to execute the instructions, or the machine-readable storage medium may be separately stored and accessible by the computing device and the processing resource. In some examples, some modules may be implemented in circuitry.

FIG. 1 illustrates an example layout of a loudness enhancement based on multiband range compression apparatus (hereinafter also referred to as "apparatus 100").

In some examples, the apparatus 100 may include or be provided as a component of a device such as a notebook, a desktop computer, a mobile telephone, a tablet, and other such devices. For the example of FIG. 1, the apparatus 100 is illustrated as being provided as a component of a device 150, which may include a notebook, a desktop computer, a mobile telephone, a tablet, and other such devices. In some examples, multiband range compression generated or otherwise implemented by the apparatus 100 as disclosed herein may be provided as a component of the device 150 (e.g., see FIG. 2), without other components of the apparatus 100.

Figure 15:
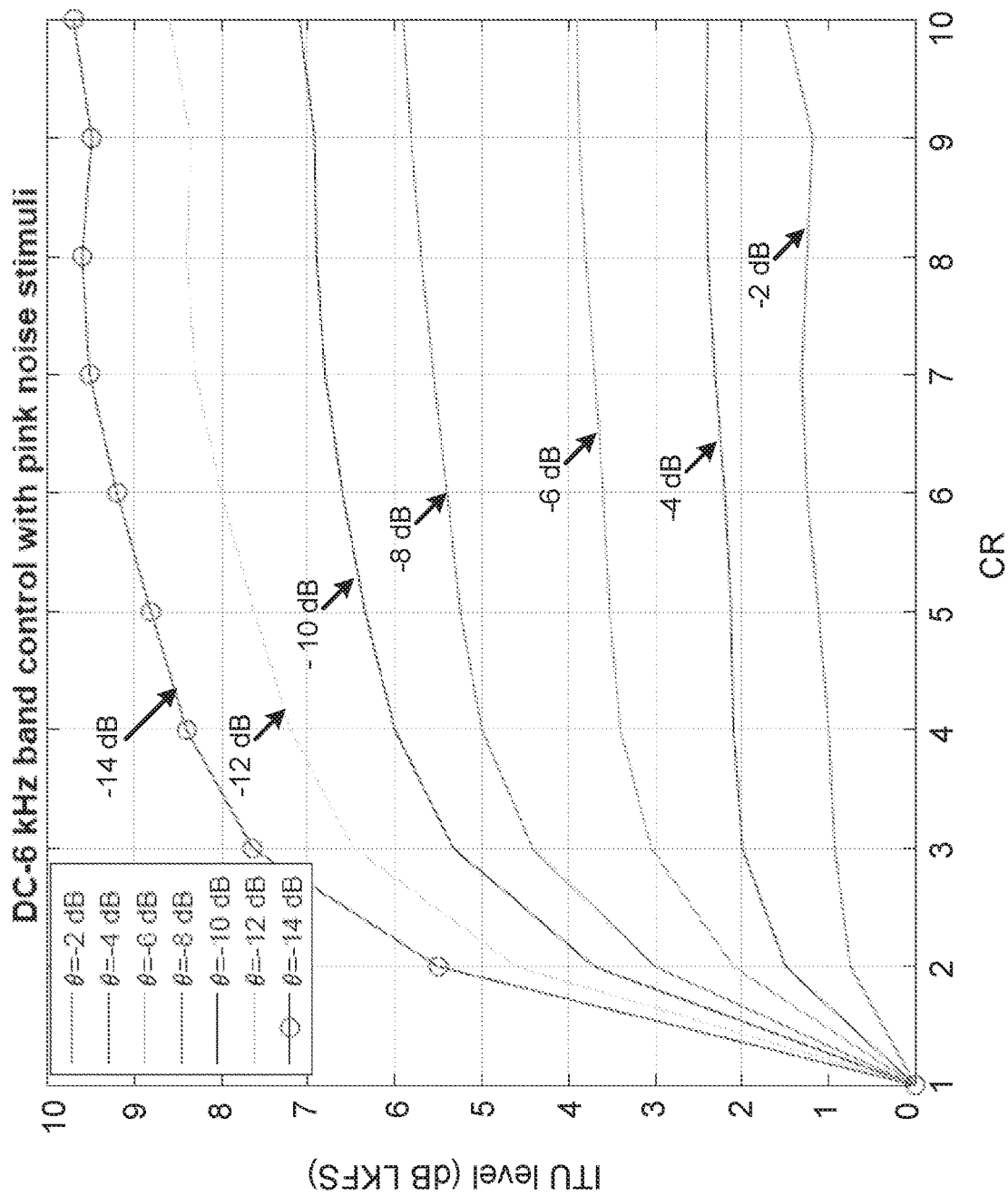
FIG. 15 illustrates fifth-order fit to obtain ITU values for CR not in the integer set of {1,8}.

Referring to FIG. 1 and also as disclosed herein with respect to FIG. 15, the apparatus 100 may include a loudness variation determination module 102 to determine, based on variations in compression parameters 104 that include compression thresholds and compression ratios, corresponding variations in loudness levels for a specified loudness standard 106. For example, the specified loudness standard 106 may include the ITU-R BS.1770 standard for loudness.

Figure 16:
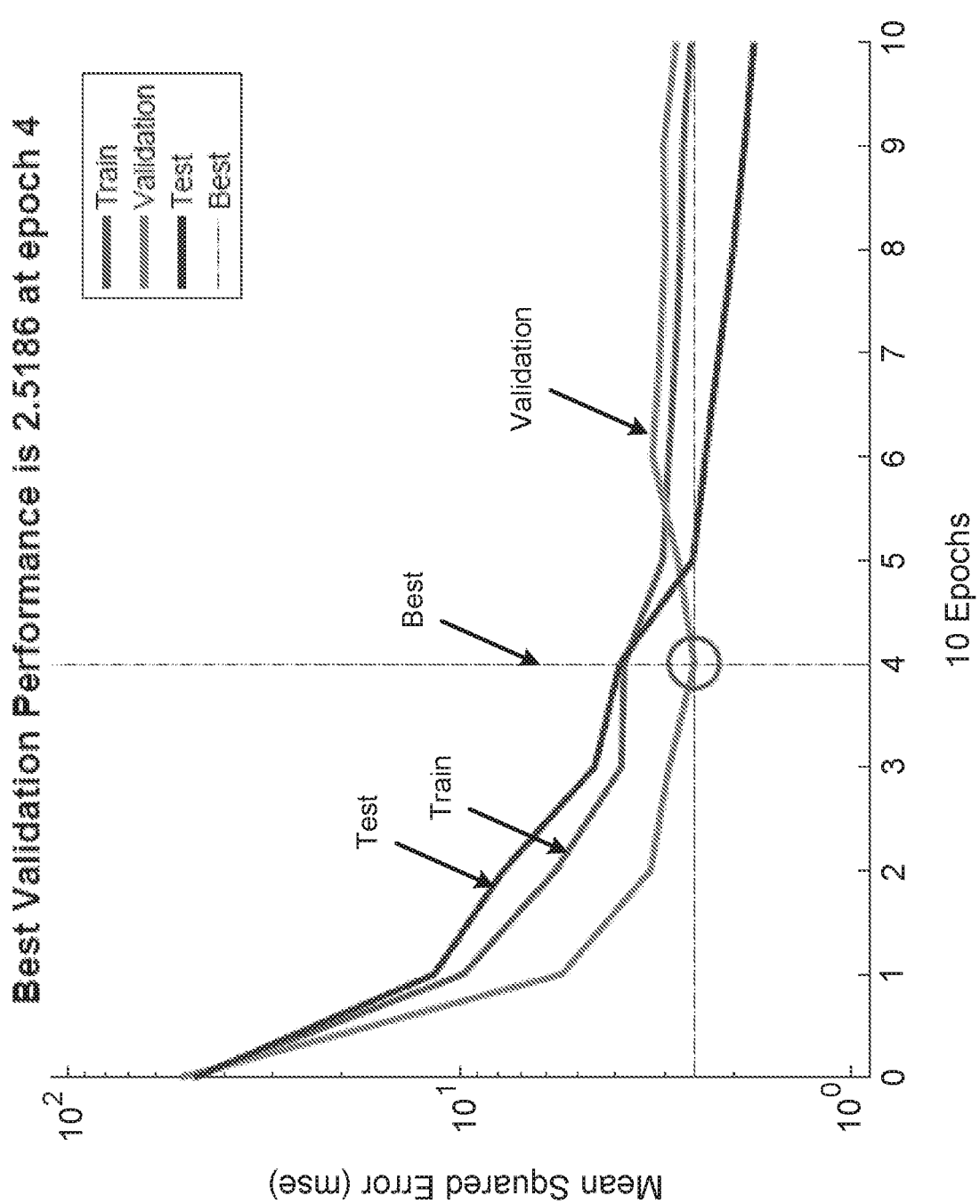
FIG. 16 illustrates training results with two-input, single hidden layer with five neurons, and single output neuron.

As disclosed herein with respect to FIGS. 1 and 16, a learning model implementation module 108 is to train a learning model 110 based on the variations in the compression parameters 104 and the corresponding variations in the loudness levels.

A specified loudness level determination module 112 is to ascertain a specified loudness level 114 for a device, such as the device 150.

A compression parameters determination module 116 is to determine, based on the trained learning model 110 (which may also be designated as a machine learning model, and include, for example, a neural network with an input layer, a hidden layer, and an output layer comprising neurons in each layer), the compression parameters 104 for the specified loudness level 114. In this regard, the trained learning model 110 may be used to determine, for example, the compression parameters 104 for the specified loudness level 114. Alternatively, the trained learning model 110 may be used to determine, for example, one of the compression parameters (e.g., compression threshold or compression ratio) based on an input of the specified loudness level 114 and another one of the compression parameters (e.g., compression threshold or compression ratio).

A sub-band compression module 118 is to perform, based on the determined compression parameters 104, sub-band compression of an input audio signal 120 by processing the input audio signal using a perfect reconstruction filterbank 122. The sub-band compression module 118 is to generate an output audio signal 124 based on the performance of the sub-band compression of the input audio signal 120. The output audio signal may be applied to another device, or to the device 150 to generate the specified loudness level 114. The compression parameters may be determined in each of the sub-bands using the learning model and the ITU loudness standard as disclosed here.

Figure 4:
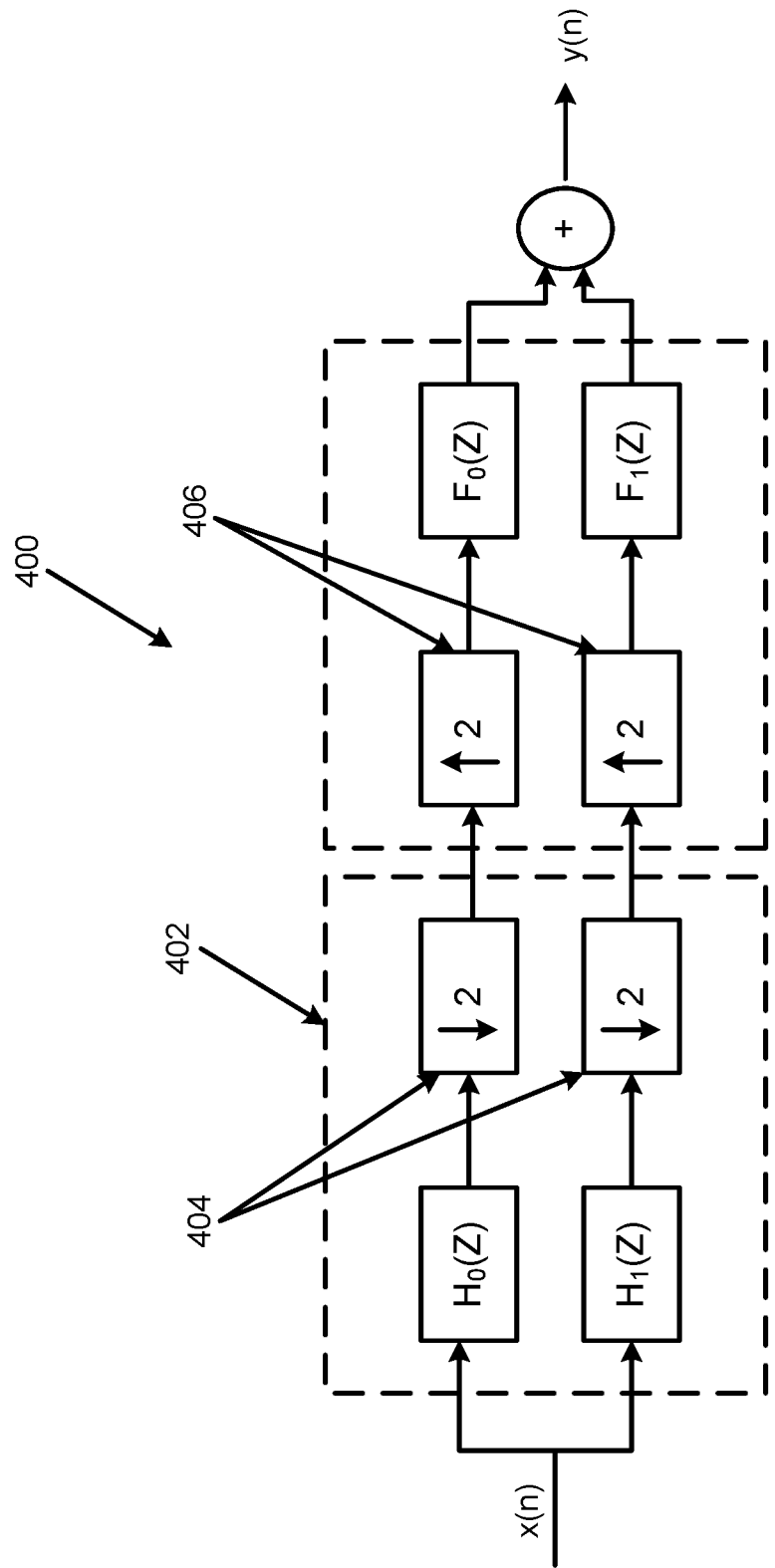
FIG. 4 illustrates an example layout of a two-channel (two-band) perfect reconstruction filterbank.

According to an example, as disclosed herein with respect to FIG. 4, the perfect reconstruction filterbank 122 may include a two-channel perfect reconstruction filterbank, and the two-channel perfect reconstruction filterbank divides a band associated with the input audio signal 120 in approximately one-half. Additional nested configurations may be used to design a perfect reconstruction fitlerbank for use with the dynamic range compression.

Figure 5:
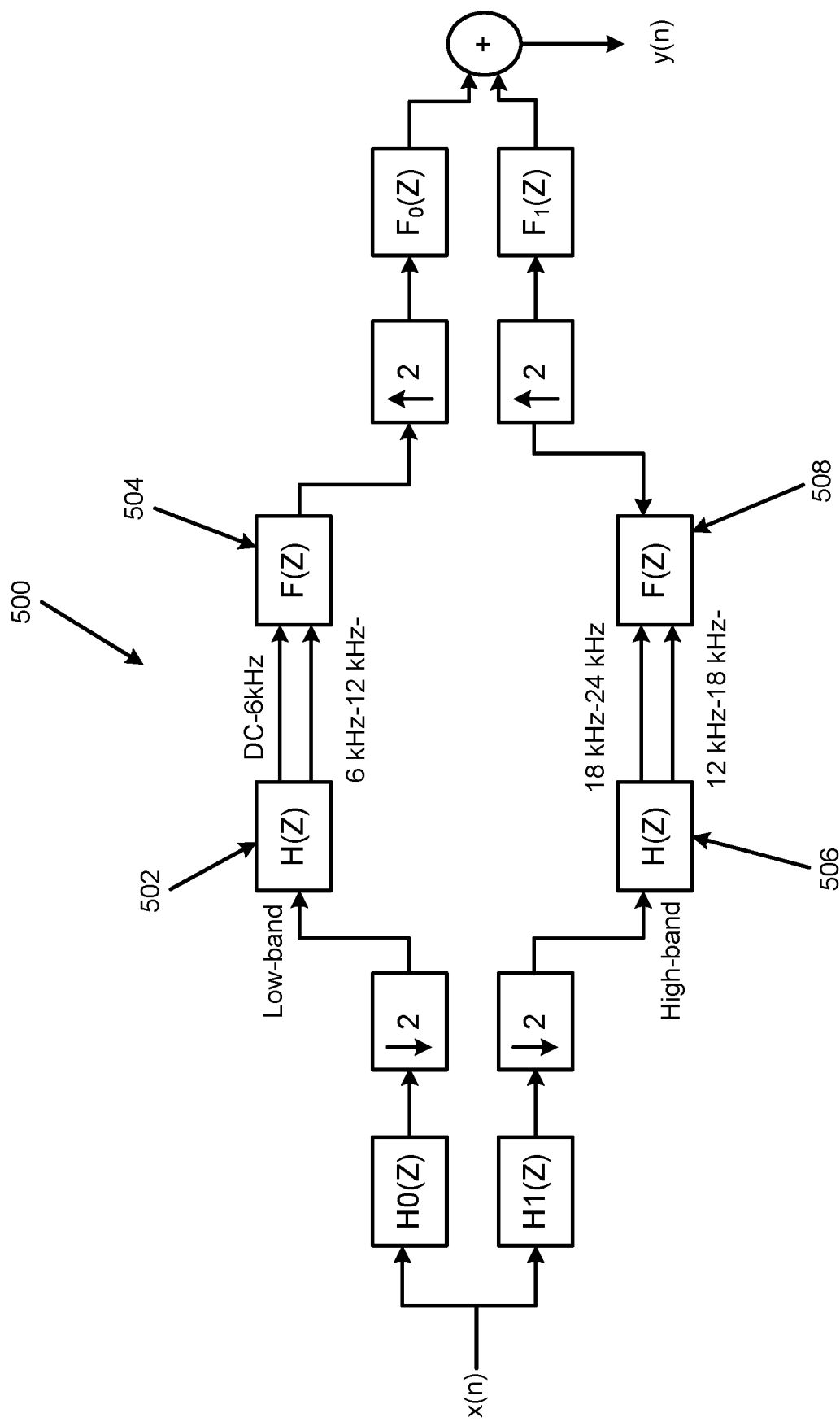
FIG. 5 illustrates an example layout of a nested four-channel perfect reconstruction filterbank.

According to an example, as disclosed herein with respect to FIG. 5, the perfect reconstruction filterbank 122 may include a four-channel nested perfect reconstruction filterbank, and the four-channel nested perfect reconstruction filterbank divides a band associated with the input audio signal 120 in approximately four bands.

According to an example, as disclosed herein with respect to Equations (5) to (7) discussed below, the sub-band compression module 118 is to perform the sub-band compression of the input audio signal 120 by applying a first predetermined gain value to a corresponding band of the input audio signal 120 as a function of a compression threshold and a knee-width of the determined compression parameters 104 for a first specified duration of the input audio signal 120. Further, the sub-band compression module 118 is to perform the sub-band compression of the input audio signal 120 by applying a second predetermined gain value to the corresponding band of the input audio signal 120 as a function of the compression threshold, a compression ratio of the determined compression parameters 104, and the knee-width for a second specified duration of the input audio signal 120.

Figure 2:
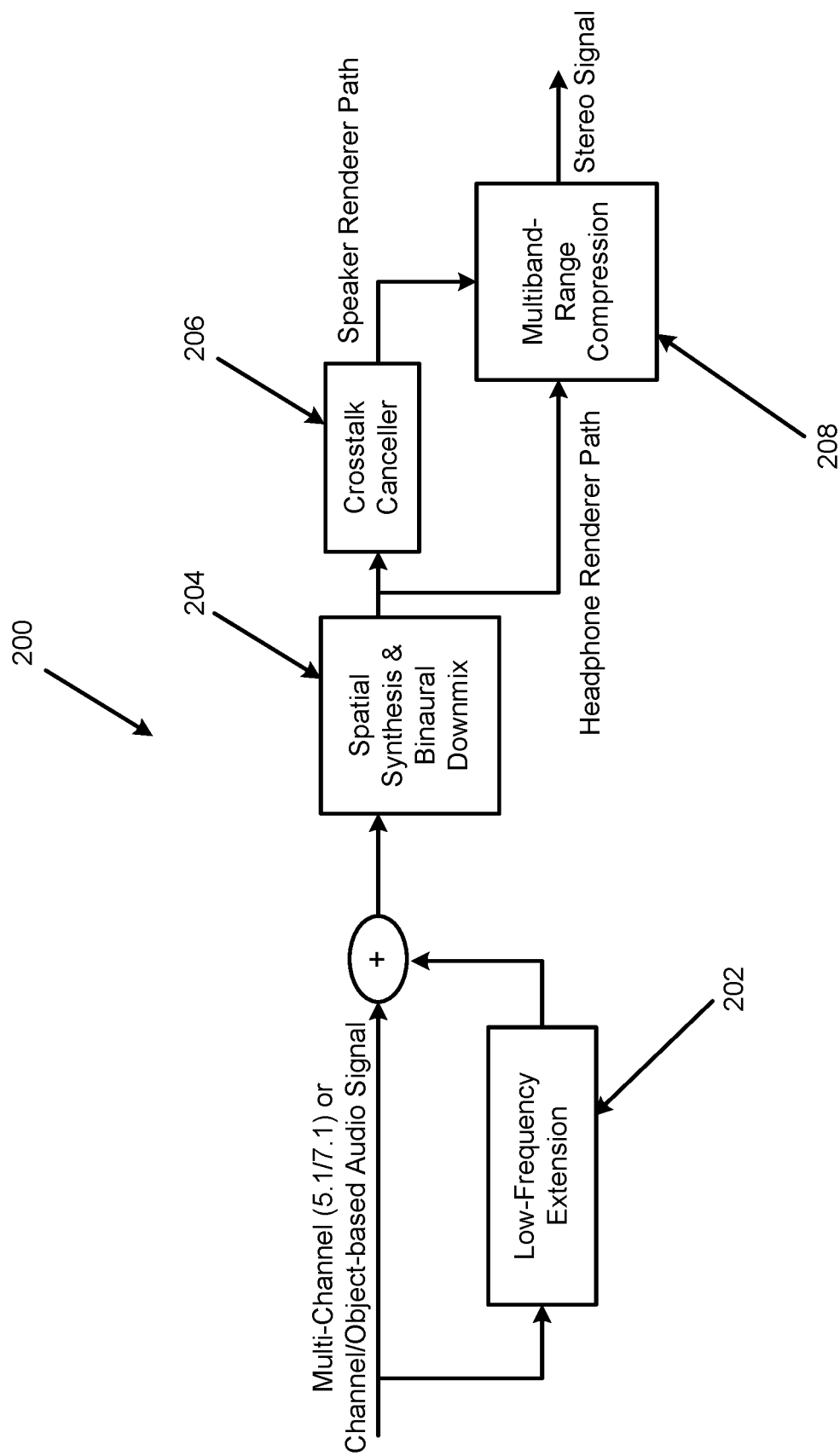
FIG. 2 illustrates an example layout of an immersive audio renderer.

FIG. 2 illustrates an example layout of an immersive audio renderer 200.

Referring to FIG. 2, the apparatus 100 may be implemented in the immersive audio renderer 200 of FIG. 2. The immersive audio renderer 200 may be integrated in consumer, commercial, and mobility devices, in the context of multichannel content (e.g., cinematic content). For example, the immersive audio renderer 200 may be integrated in a device such as a notebook, a desktop computer, a mobile telephone, a tablet, and other such devices.

The immersive audio renderer 200 may be extended to accommodate next-generation audio formats (including channel/objects or pure object-based signals and metadata) as input to the immersive audio renderer 200.

The immersive audio renderer 200 may include a low-frequency extension 202 that performs a synthesis of nonlinear terms of the low pass audio signal in the side chain. Specifically auditory motivated filterbanks filter the audio signal, the peak of the signal may be tracked in each filterbank, and the maximum peak over all peaks or each of the peaks may be selected for nonlinear term generation. The nonlinear terms for each filterbank output may then be band pass filtered and summed into each of the channels to create the perception of low frequencies.

The immersive audio renderer 200 may include spatial synthesis and binaural downmix 204 where reflections and specified direction sounds may be mixed in prior to crosstalk cancellation. For example, the spatial synthesis and binaural downmix 204 may apply head-related transfer functions (HRTFs) to render virtual sources at desired angles (and distances). According to an example, the HRTFs may be perceptually-smoothed, and the perceptually-smoothed HRTFs may be for angles ±40° for the front left and front right sources (channels), 0° for the center, and ±110° degrees for the left and right surround sources (channels).

Figure 3:
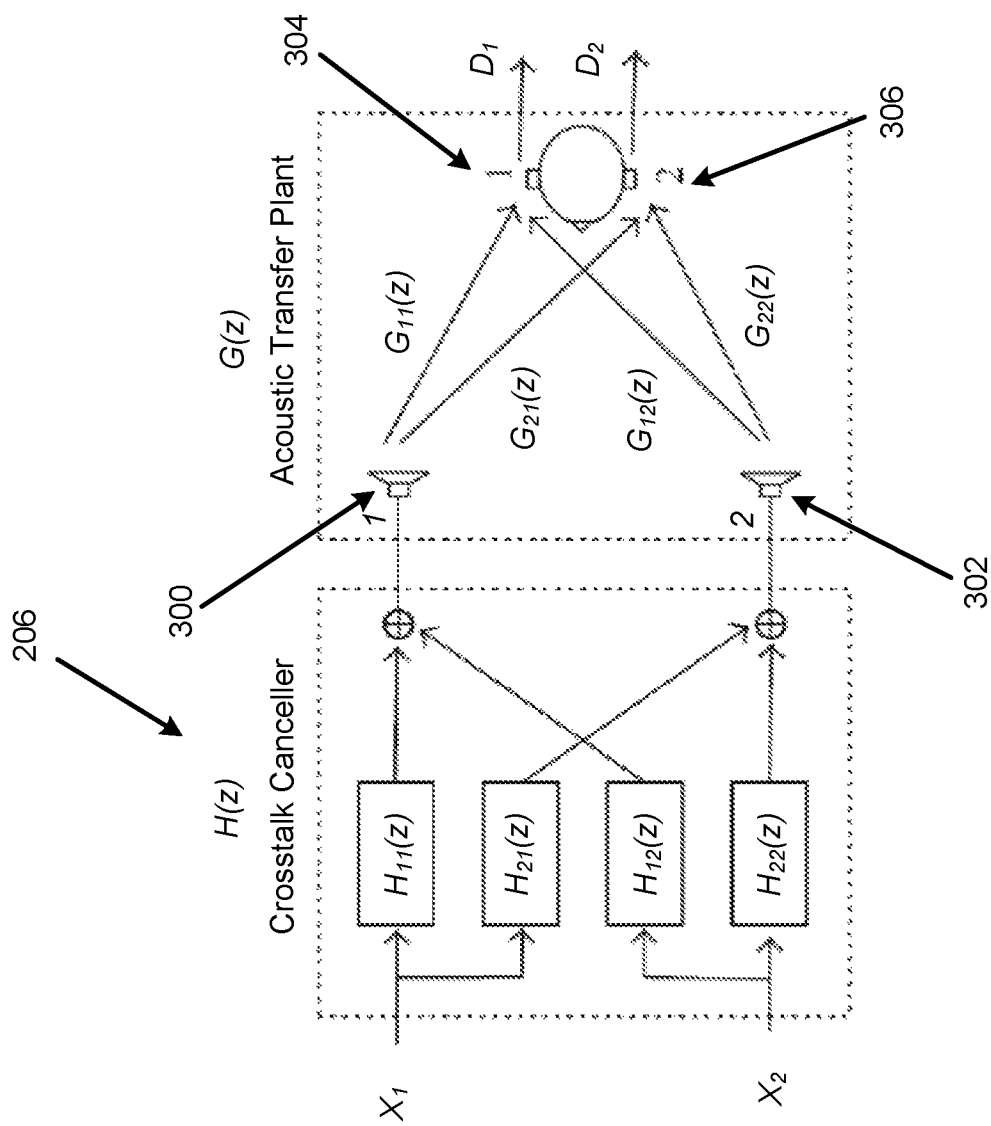
FIG. 3 illustrates an example layout of the crosstalk canceller and a binaural acoustic transfer function.

The immersive audio renderer 200 may include a crosstalk canceller 206 to perform crosstalk cancellation on a spatial synthesized audio signal, as described in further detail with respect to FIG. 3.

The immersive audio renderer 200 may include multiband range compression 208 that performs multiband compression, for example, by using perfect reconstruction (PR) filterbanks, an ITU loudness model, and a neural network to generalize to arbitrary multiband dynamic range compression (DRC) parameter settings, as described in further detail herein.

With respect to the crosstalk canceller 206, FIG. 3 illustrates an example layout of the crosstalk canceller 206 and a binaural acoustic transfer function.

The crosstalk canceler 206 may be used to perform equalization of the ipsilateral signals (loudspeaker to same side ear) and cancel out contralateral crosstalk (loudspeaker to opposite side ear). FIG. 3 shows the crosstalk canceler 206 for canceling the crosstalk at the two ears (viz., reproducing left-channel program at the left ear and the right-channel program at the right-ear).

Referring to FIG. 3, for the crosstalk canceller 206, the acoustic path ipsilateral responses $G_{11}(z)$ and $G_{22}(z)$ (e.g., same-side speaker as the ear) and contralateral responses $G_{12}(z)$ and $G_{21}(z)$ (e.g., opposite-side speaker as the ear) may be determined based on the distance and angle of the ears to the speakers. For example, FIG. 3 illustrates speakers 300 and 302, respectively also denoted speaker-1 and speaker-2 in FIG. 1. Further, a user's ears corresponding to the destinations 304 and 306 may be respectively denoted as ear-1 and ear-2. In this regard $G_{11}(z)$ may represent the transfer function from speaker-1 to ear-1, $G_{22}(z)$ may represent the transfer function from speaker-2 to ear-2, and $G_{12}(z)$ and $G_{21}(z)$ may represent the crosstalks. The crosstalk canceller 206 may be denoted by the matrix H(z), which may be designed to send a signal $X_1$ to ear-1, and a signal $X_2$ to ear-2. For the example of FIG. 3, the angle of the ears to the speakers 300 and 302 may be specified as 15° relative to a median plane, where devices such as notebooks, desktop computers, mobile telephones, etc., may include speakers towards the end or edges of a screen.

For the example layout of the crosstalk canceller and the binaural acoustic transfer function of FIG. 3, the acoustic responses (viz., the $G_{ij}(z)$ for the source angles) may include the HRTFs corresponding to ipsilateral and contralateral transfer paths. The HRTFs may be obtained from an HRTF database, such as an HRTF database from the Institute for Research and Coordination in Acoustics/Music (IRCAM).

Crosstalk cancellation with respect to the crosstalk canceller 206 may be based on perceptual smoothing of HRTFs, insertion of an inter-aural time difference, and time-domain inversion of a regularized matrix determined from the perceptually smoothed HRTFs. For example, a constrained inversion of the perceptually smoothed HRTFs may be performed through the use of regularization, and validation of a condition number of a regularized matrix before inversion. In this regard, a tradeoff may be achieved, for example, by analyzing the condition number with respect to an objective cancellation performance, a subjective audio quality, and robustness to head-movements.

For the crosstalk canceller 206, a perceptual smoothing may be performed on HRTFs corresponding to ipsilateral and contralateral transfer paths of sound emitted from first and second speakers (e.g., see FIG. 1), respectively, to corresponding first and second destinations. According to an example, the perceptual smoothing may include phase and magnitude smoothing, or complex smoothing of the HRTFs. According to an example, the first and second destinations may respectively correspond to first and second ears of a user.

An inter-aural time difference may be inserted in the perceptually smoothed HRTFs corresponding to the contralateral transfer paths. According to an example, the inter-aural time difference may be determined as a function of a head radius of the user, and an angle of one of the speakers (e.g., see FIG. 1) from a median plane of a device (e.g., the device 150) that includes the speakers.

The crosstalk canceller 206 may be generated by inverting the perceptually smoothed HRTFs corresponding to the ipsilateral transfer paths and the perceptually smoothed HRTFs corresponding to the contralateral transfer paths including the inserted inter-aural time difference. According to an example, the crosstalk canceller 206 may be generated by performing a time-domain inversion of a regularized matrix determined from the perceptually smoothed HRTFs corresponding to the ipsilateral transfer paths and the perceptually smoothed HRTFs corresponding to the contralateral transfer paths including the inserted inter-aural time difference. In this regard, a time-domain matrix may be determined from the perceptually smoothed HRTFs corresponding to the ipsilateral transfer paths and the perceptually smoothed HRTFs corresponding to the contralateral transfer paths including the inserted inter-aural time difference. Further, a regularization term (e.g., β) may be determined to control inversion of the time-domain matrix, and the time-domain matrix may be inverted based on the regularization term to generate the regularized matrix. Further, the regularization term to control the inversion of the time-domain matrix may be determined by comparing a condition number associated with a transpose of the time-domain matrix to a threshold (e.g., 100), and in response to a determination that the condition number is below the threshold, the time-domain matrix may be inverted based on the regularization term to generate the regularized matrix. Thus, the condition number of the regularized matrix may be validated prior to the performing of the time-domain inversion of the regularized matrix.

Referring again to FIG. 2, with respect to the multiband range compression 208, in order to perform sub-band compression in different frequency-bands at low computational needs, sub-band analysis and synthesis filters in the filterbank may be specified to satisfy the perfect reconstruction property. Specifically, an impulse function supplied as input to the filterbank-decimation-interpolation system should result in an output that is an impulse function (or a delayed version of an impulse, with the delay accounting for overall latency incurred by the design). The decimation may allow for sub-band compression processing at a reduced sample rate, and thereby allow reduced computational needs.

FIG. 4 illustrates an example layout of a two-channel (two-band) perfect reconstruction filterbank 400 (e.g., the perfect reconstruction filterbank 122 of FIG. 1).

Referring to FIG. 4, the sub-band compression module 118 may perform, based on the determined compression parameters 104, sub-band compression of the input audio signal 120 by processing the input audio signal using a perfect reconstruction filterbank 400 (e.g., the perfect reconstruction filterbank 122 of FIG. 1).

With continued reference to FIG. 4, the block diagram illustrates a two-channel filterbank with the filters dividing the Nyquist band roughly half-way (e.g., direct current (DC) to 12 kHz, and 12 kHz to 18 kHz). These analysis filters 402 may perform the role also of anti-aliasing filters that may be implemented prior to decimation of the input signal (e.g., x(n)) to a half sample-rate (viz., 24 kHz from 48 kHz). The "2" blocks at 404 for the perfect reconstruction filterbank 400 represent dissemination by a factor of two to separate the band of the input signal (x(n)) into a lower band and an upper band. Further, the "2" blocks at 406 for the perfect reconstruction filterbank 400 represent interpolation by a factor of two to interpolate the lower band and the upper band to determine the output signal y(n).

FIG. 5 illustrates an example layout of a nested four-channel perfect reconstruction filterbank 500.

Referring to FIG. 5, in order to design the four-band perfect reconstruction filterbank 500, a nested approach may be implemented with multiple stages of decimation and interpolation as shown in FIG. 5. The dynamic range compression disclosed herein with respect to Equations (5) to (7), and FIG. 10 may be positioned between blocks 502 and 504, and 506 and 508 for each of the sub-bands (e.g., DC-6 kHz, 6 kHz-12 kHz, etc.). The filters may be power-complementary, and satisfy Equations (1) to (4):

$$F_0(z) = \frac{2z^{-1}\mathcal{H}_1(-z)}{|\mathcal{H}^{(m)}(z)|} \quad \text{Equation (1)}$$

$$F_1(z) = -\frac{2z^{-1}\mathcal{H}_0(-z)}{|\mathcal{H}^m(z)|} \quad \text{Equation (2)}$$

$$|\mathcal{H}^m(z)| = \mathcal{H}_0(z)\mathcal{H}_1(-z) - \mathcal{H}_0(z)\mathcal{H}_1(z) \quad \text{Equation (3)}$$

$$z = e^{jw} \quad \text{Equation (4)}$$

For Equation (1), $F_0(z)$ represents a synthesis filter, z represents complex frequency (w=2 p f/fs, where fs is the sampling frequency and f is the frequency in Hz), and $H_1$ represents an analysis filter. For Equation (2), $F_1(z)$ represents another synthesis filter, and $H_0$ represents another analysis filter.

Figure 6:
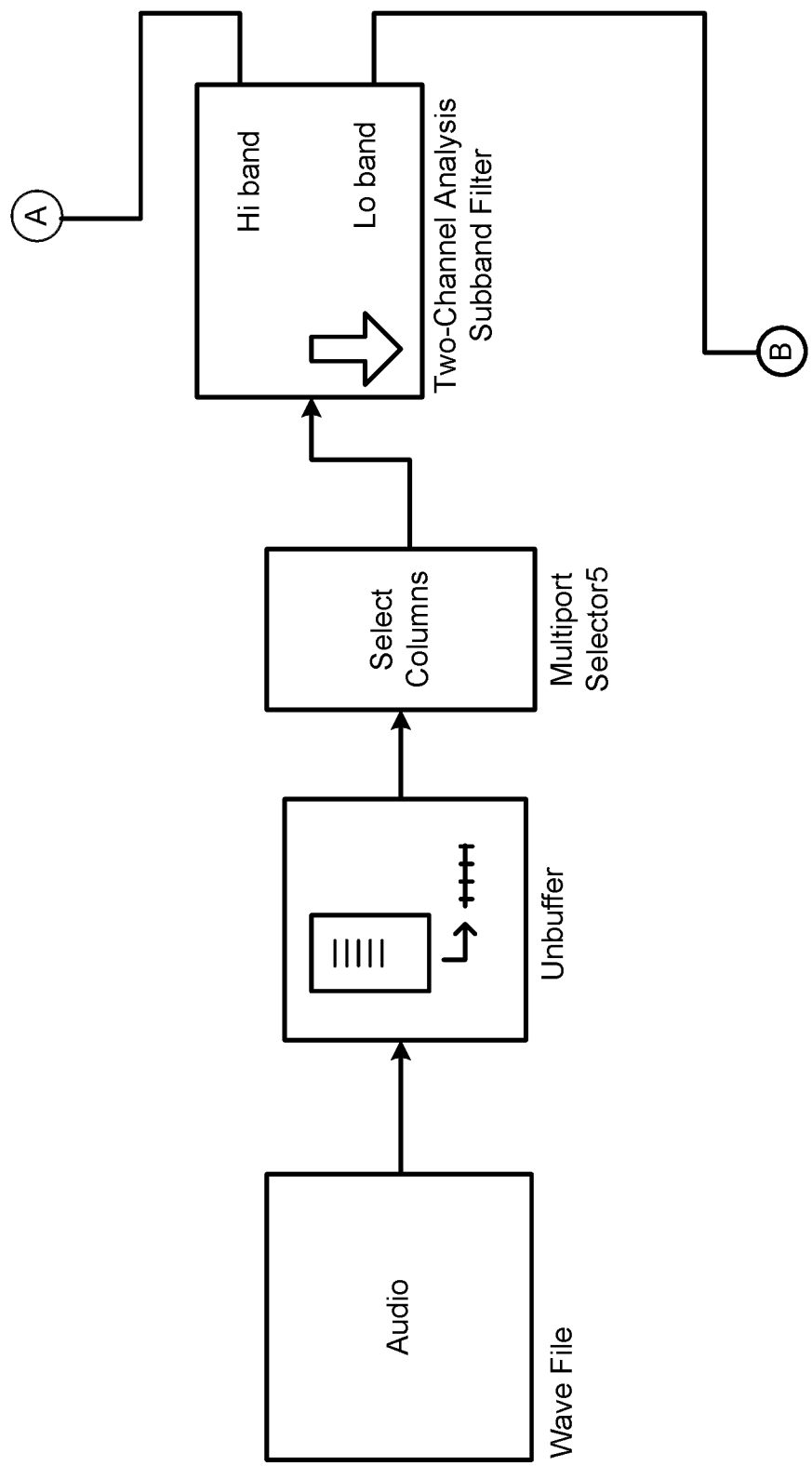
FIG. 6 illustrates an example layout of the nested four-channel perfect reconstruction filterbank of FIG. 5.
Figure 6:
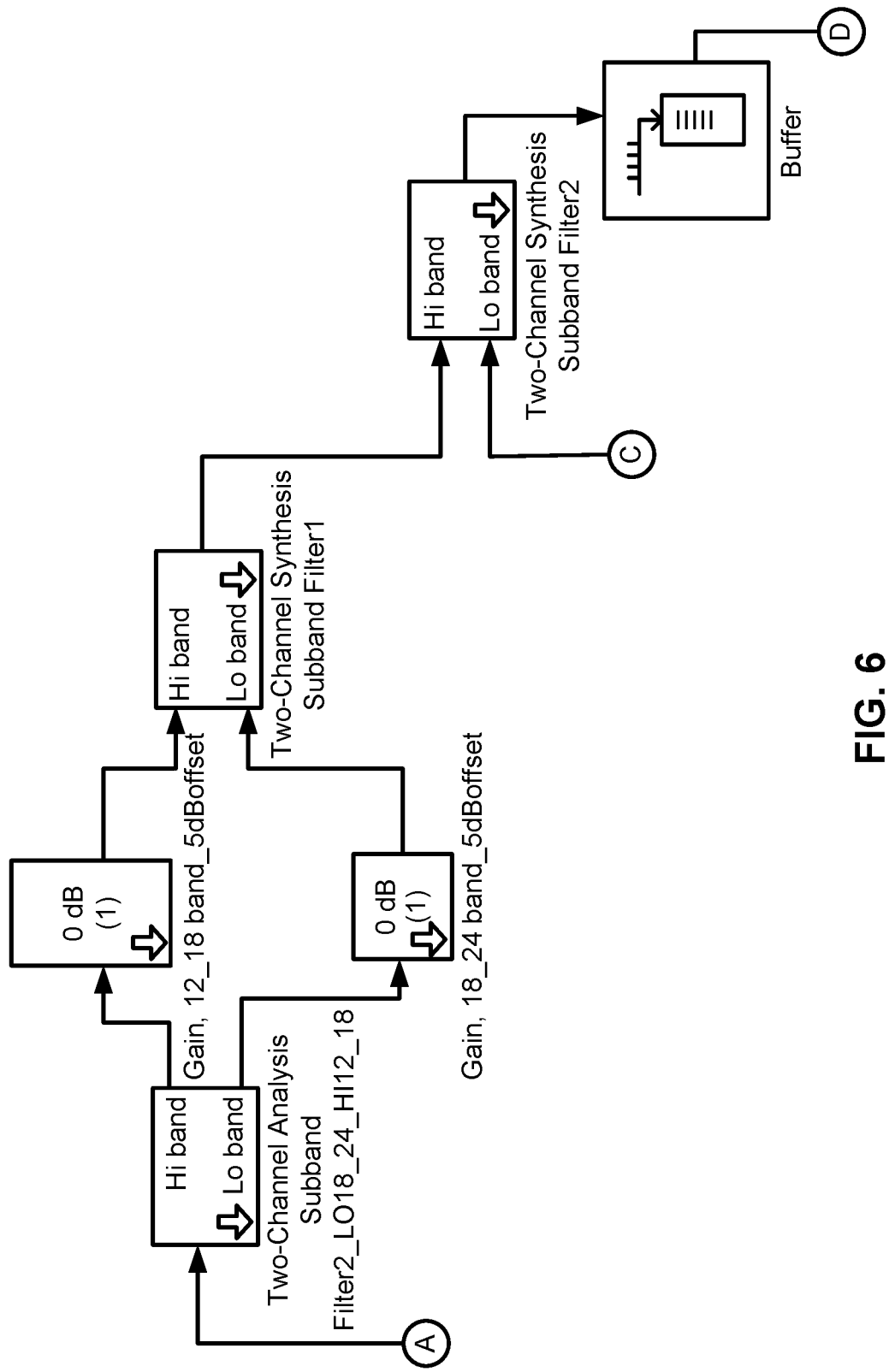
Figure 6:
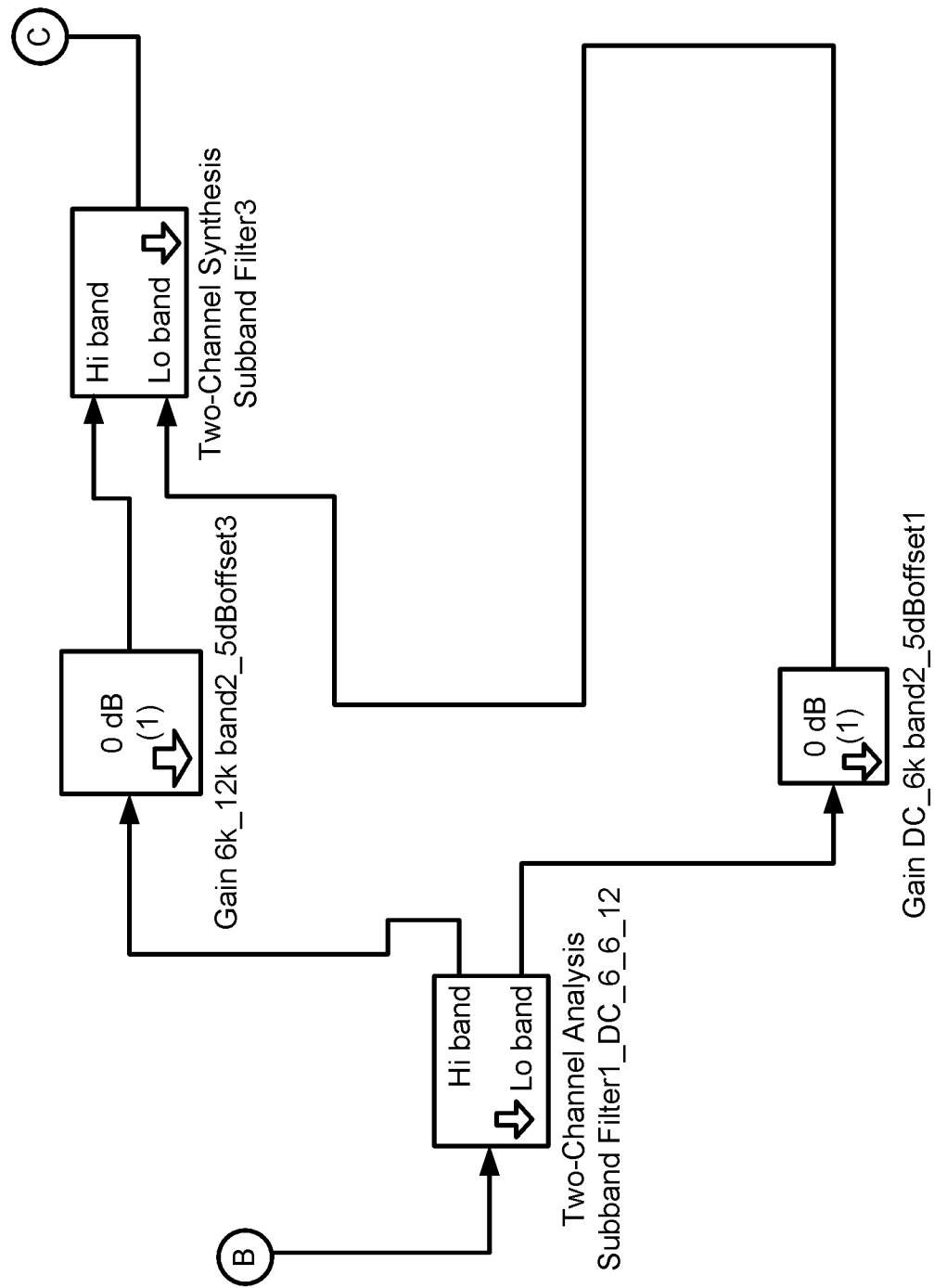
Figure 6:
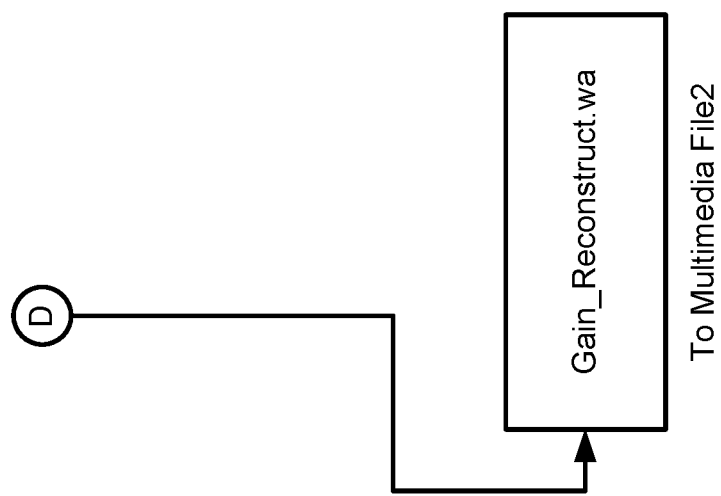

FIG. 6 illustrates an example layout of the nested four-channel perfect reconstruction filterbank of FIG. 5.

Figure 7:
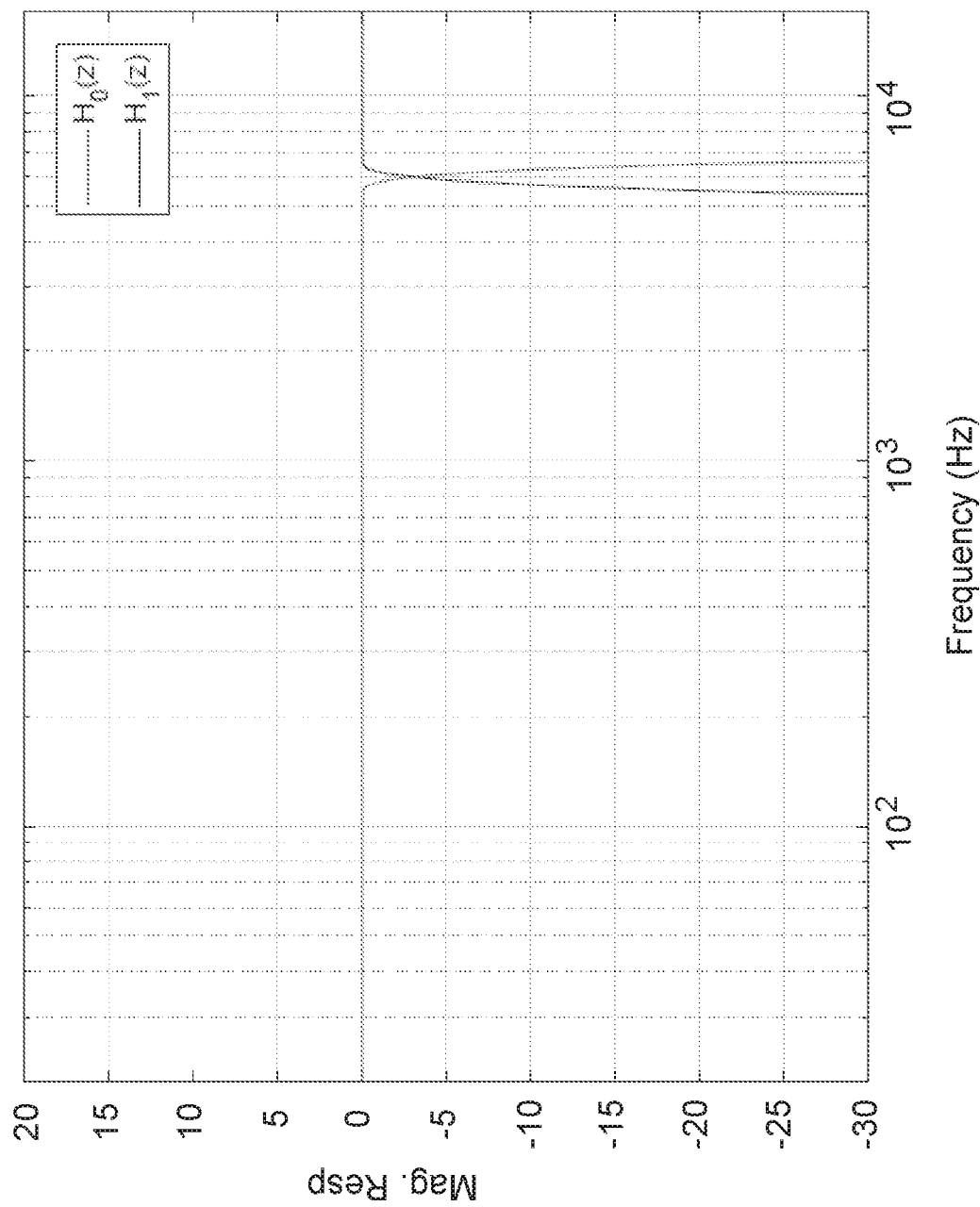
FIG. 7 illustrates analysis filters to illustrate operation of the loudness enhancement based on multiband range compression apparatus of FIG. 1.

FIG. 7 illustrates analysis filters to illustrate operation of the apparatus 100. In this regard, the graph of FIG. 7 illustrates the magnitude response of the analysis filters. The analysis filters may include the analysis filters of FIG. 4.

Figure 8:
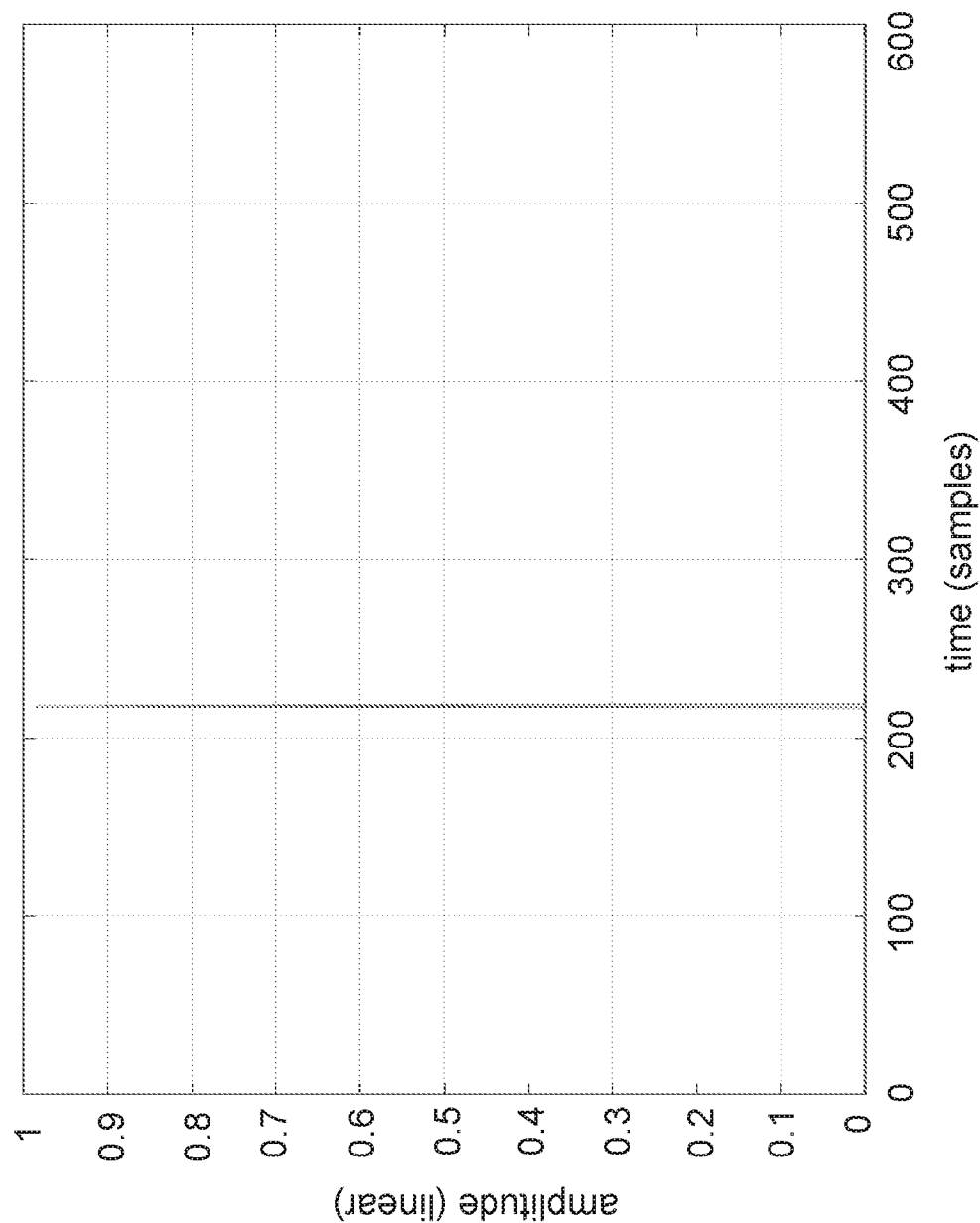
FIG. 8 illustrates output from a perfect reconstruction filterbank with impulse function input to illustrate operation of the loudness enhancement based on multiband range compression apparatus of FIG. 1.

FIG. 8 illustrates output from a perfect reconstruction filterbank with impulse function input to illustrate operation of the apparatus 100. In this regard, FIG. 8 illustrates the output from an impulse function, which is a delayed impulse with l=218 samples. The delay may be based on the processing with respect to the analysis and synthesis filters (e.g., see FIG. 4).

Figure 9:
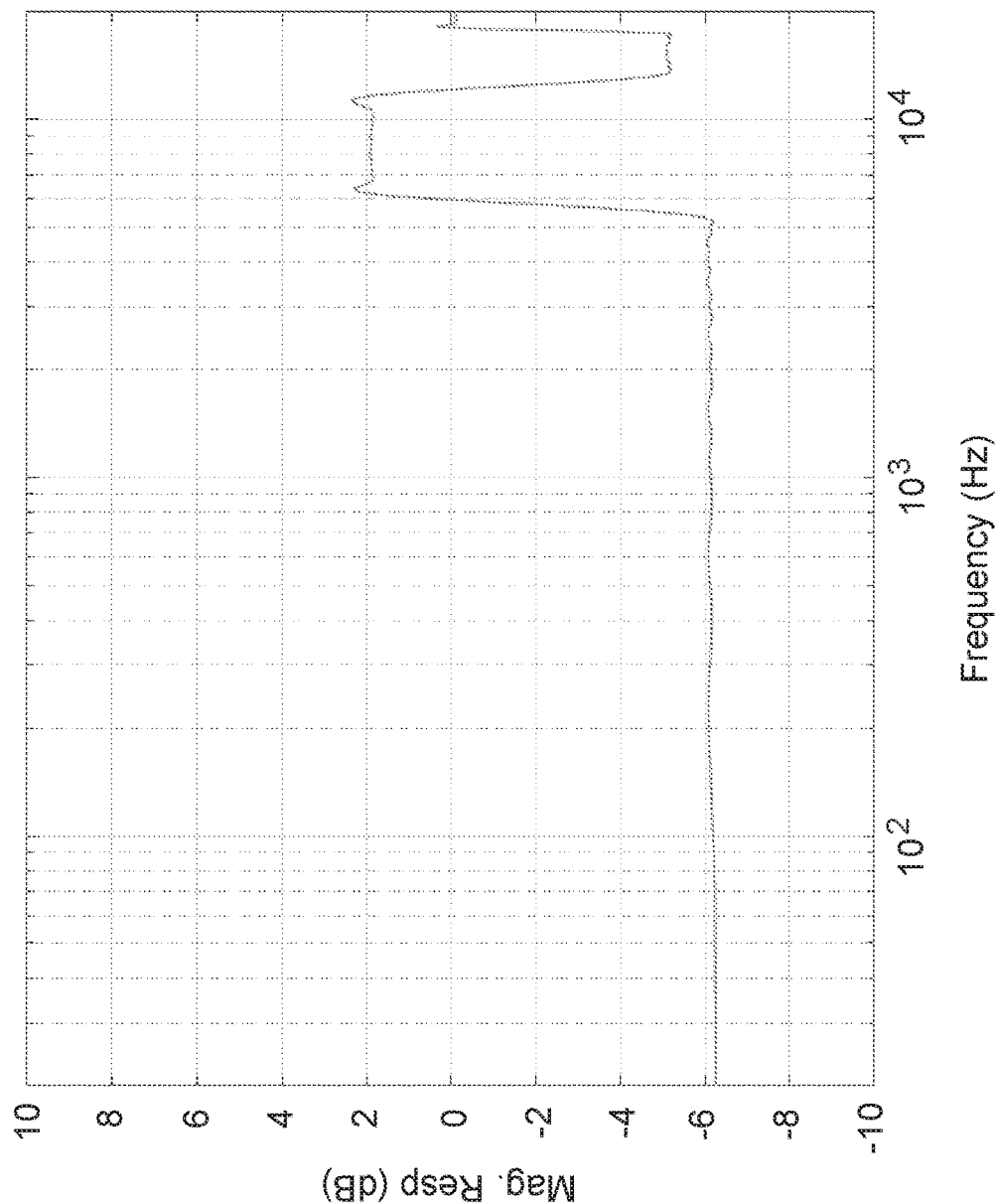
FIG. 9 illustrates output from a perfect reconstruction filterbank with impulse function input and a prescribed gain in various bands to illustrate operation of the loudness enhancement based on multiband range compression apparatus of FIG. 1.

FIG. 9 illustrates output from a perfect reconstruction filterbank with impulse function input and a prescribed gain in various bands to illustrate operation of the apparatus 100.

Referring to FIG. 9, FIG. 9 shows an example with a gain structure in the perfect reconstruction filterbank, where the gains in the bands {DC-6 kHz, 6 kHz-12 kHz, 12 kHz-18 kHz, 18 kHz-24 kHz} in the nested perfect reconstruction structure of FIG. 6 being set as {−6 dB, 2 dB, −5 dB, 0 dB} band. The results show a close match between the specification and the output. For the example of FIG. 9, each of the gain blocks may be replaced with the dynamic range compressions in each of the four sub-bands to control the loudness and quality of audio via an appropriate set of compression parameters. According to an example, the dynamic range compression in each sub-band may be premised on peak-detection of the input samples, mapping the dB of the input peak to a dB value for the output via a compression curve (with controllable parameters for each sub-band). Additional smoothing using attack and release time constants may be implemented to eliminate artifacts such as pumping, which may be noticeable as amplitude fluctuations with steady-state pink noise stimuli.

Figure 10:
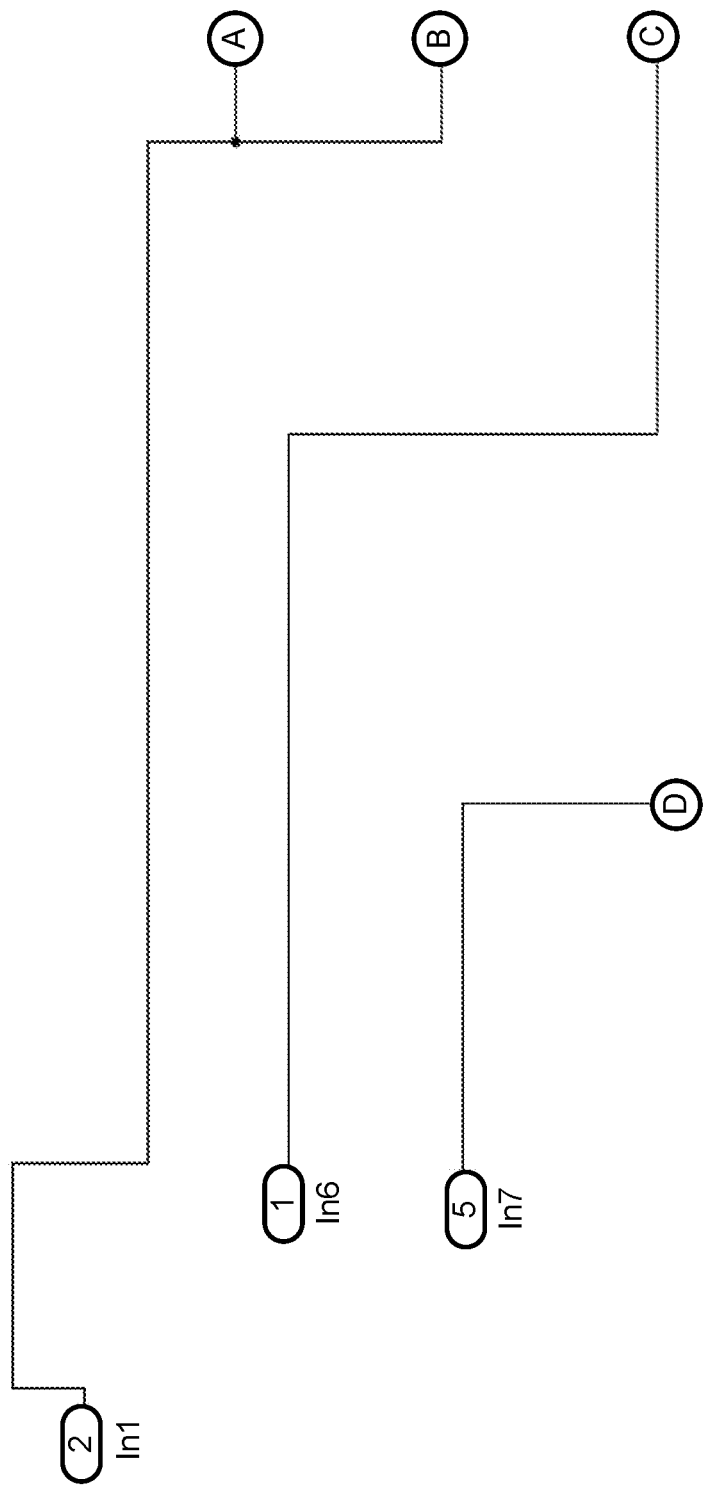
FIG. 10 illustrates implementation of dynamic range compression to illustrate operation of the loudness enhancement based on multiband range compression apparatus of FIG. 1.
Figure 10:
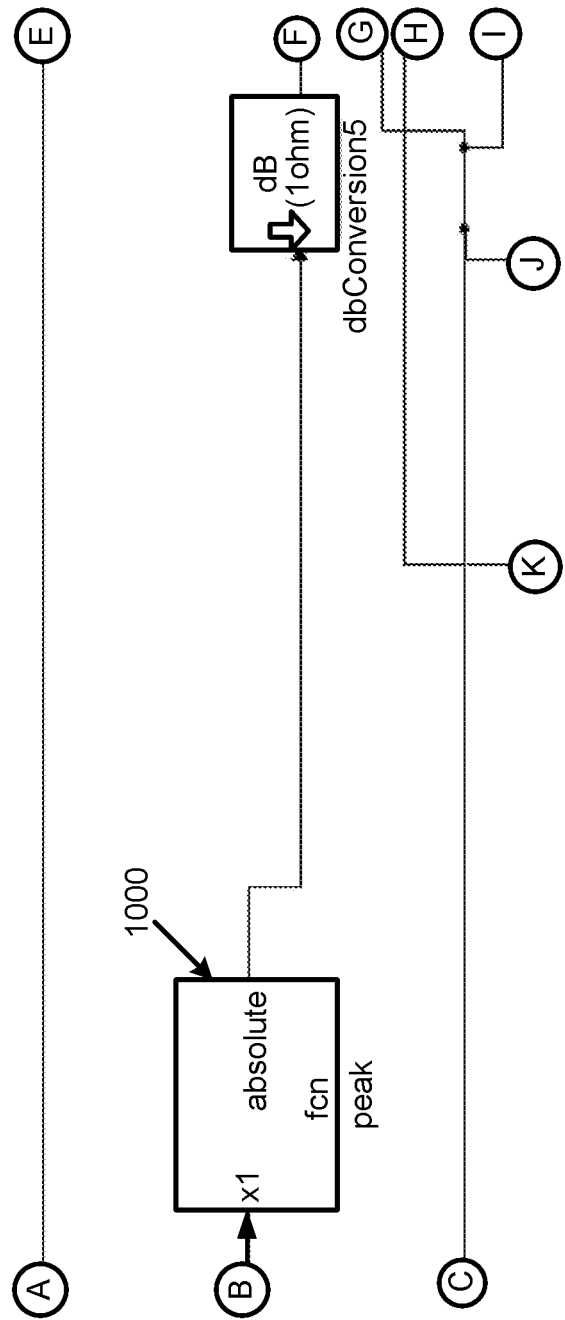
Figure 10:
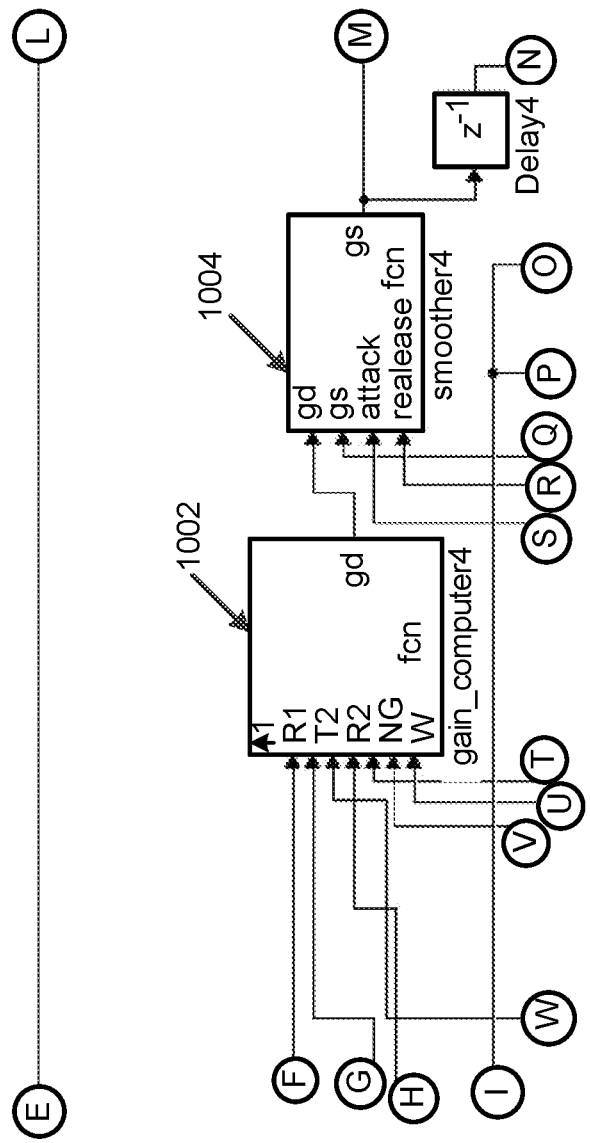
Figure 10:
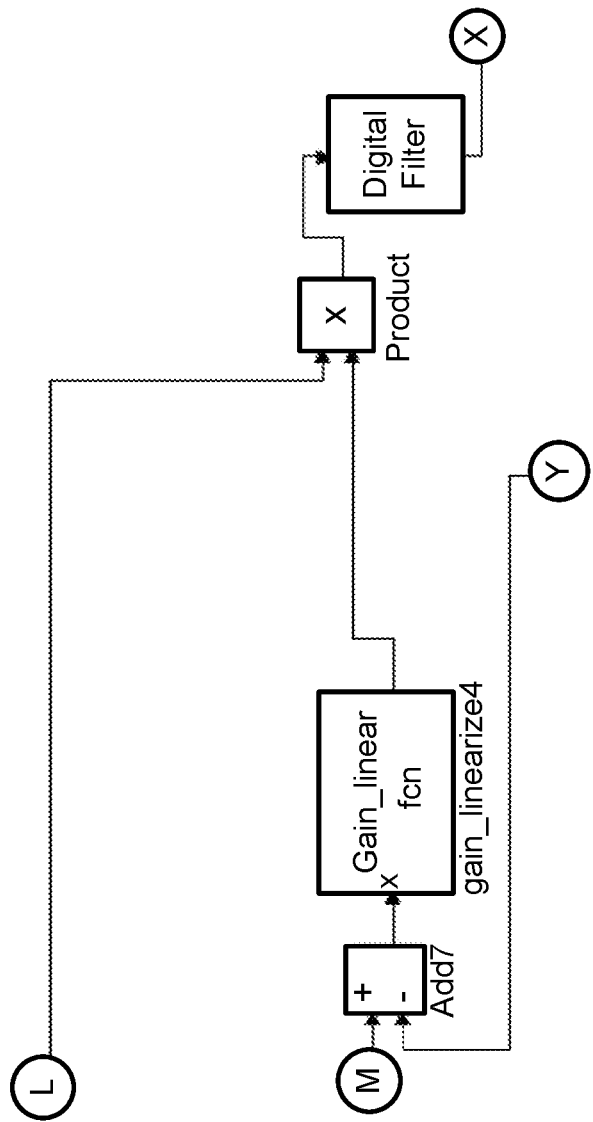
Figure 10:
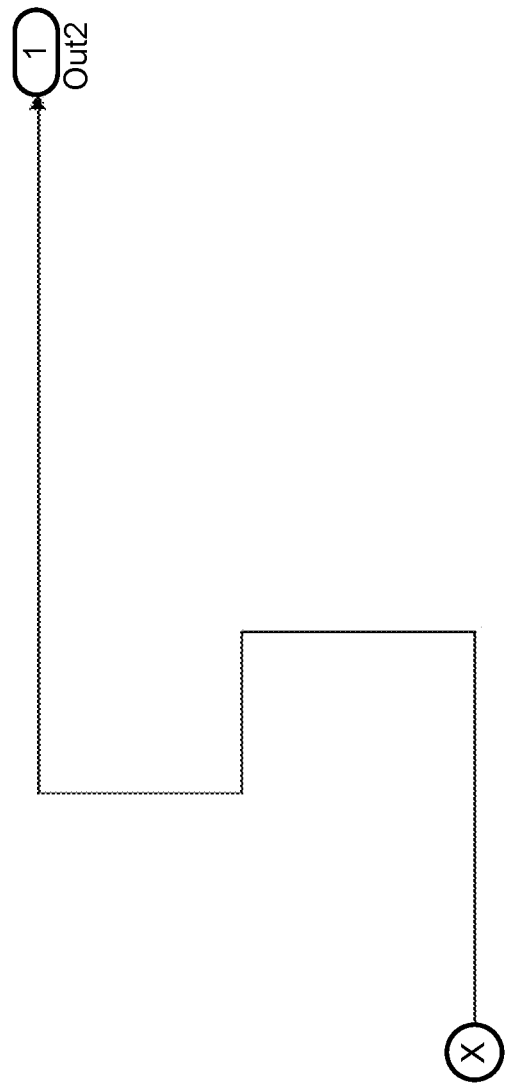
Figure 10:
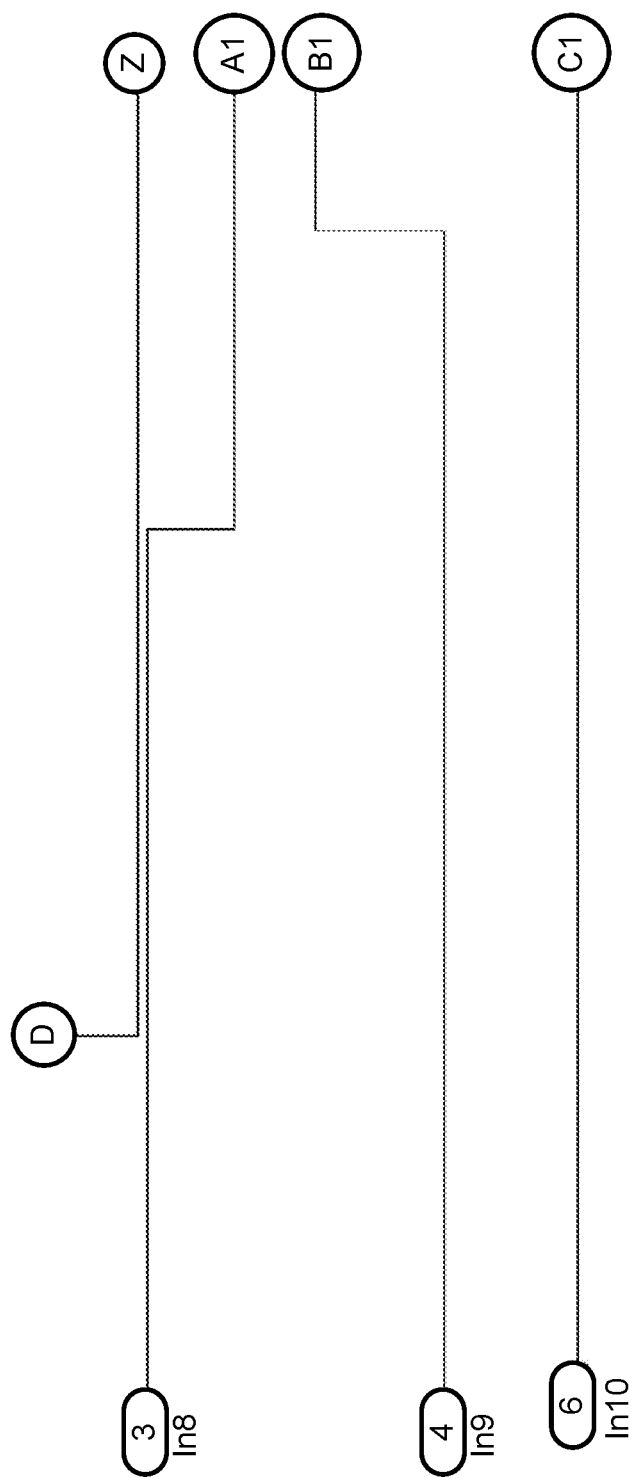
Figure 10:
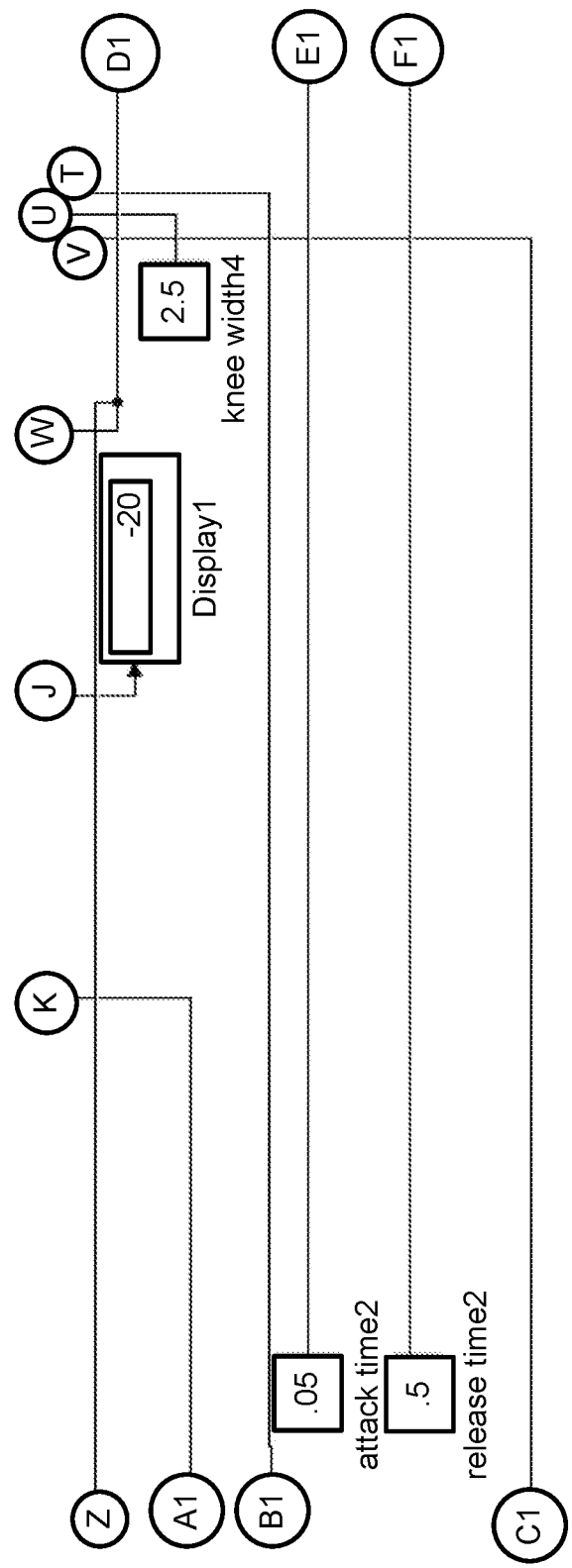
Figure 10:
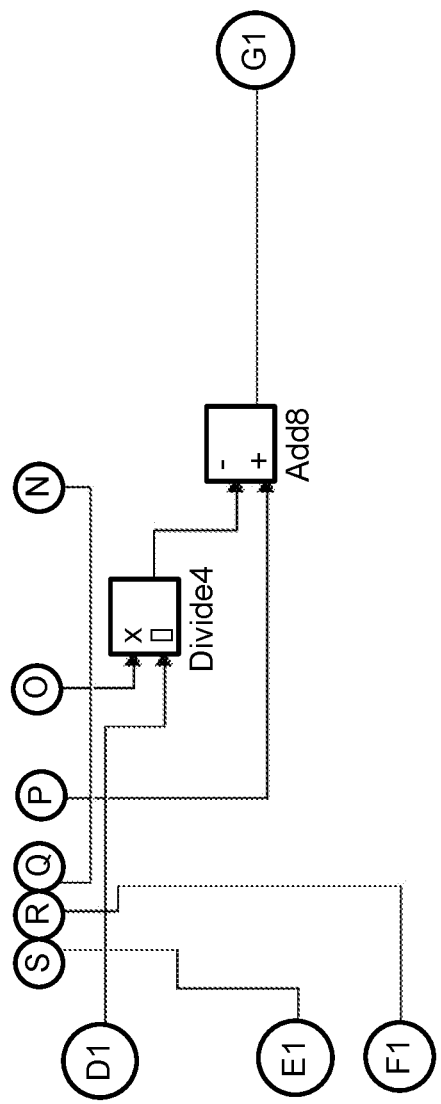
Figure 10:
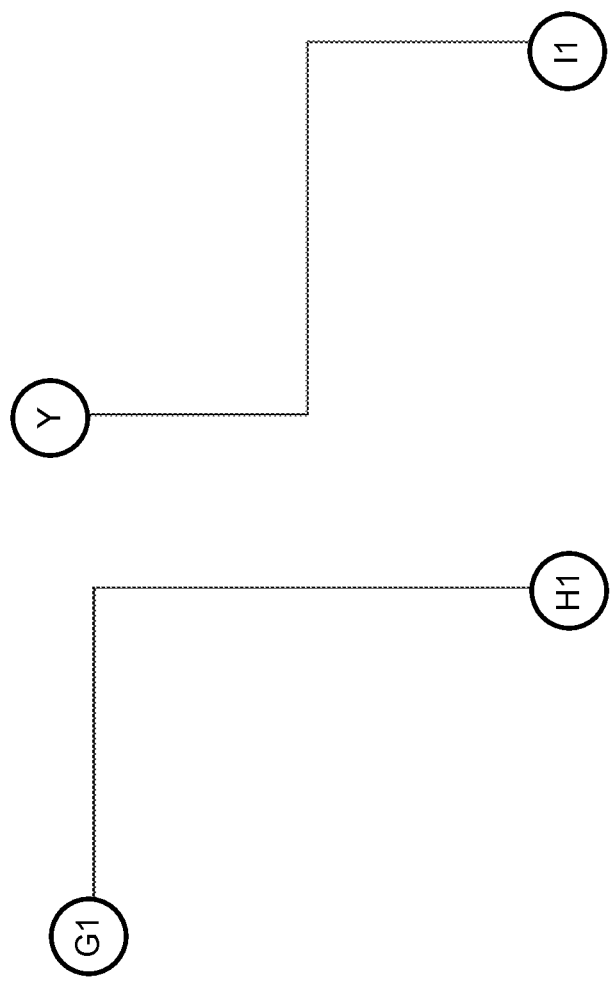
Figure 10:
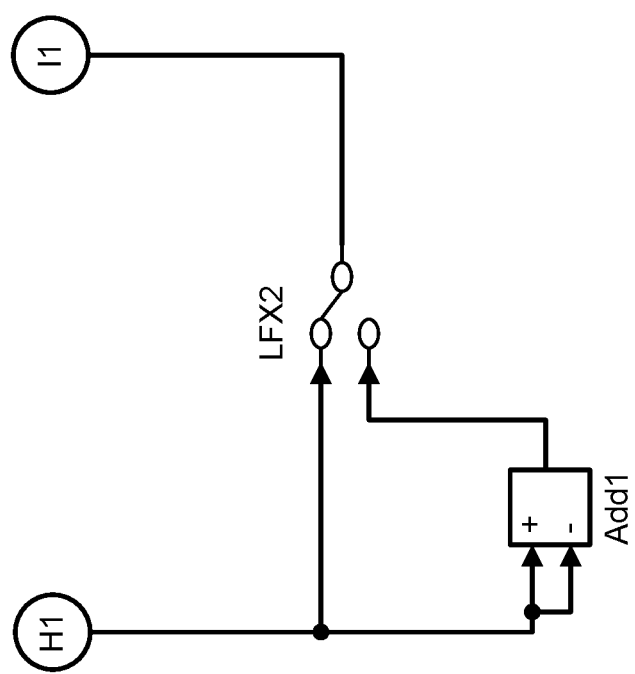

FIG. 10 illustrates implementation of dynamic range compression to illustrate operation of the apparatus 100.

Referring to FIG. 10, subsequent to the sub-band filtering (e.g., at the analysis stage), the compression in each sub-band as shown in FIG. 10 is applied (e.g., at the synthesis stage). The compression may include a first-block at 1000 that represents a peak-detection step converting the input sample to dB (viz., $20 \log_{10}|x(n)|$). The second block at 1002 may represent a gain computer that applies a compression based on the compression parameters threshold θ, compression ratio (CR), and knee-width (W). The third block at 1004 may perform smoothing on the output to allow for a smooth envelope of the audio signal, thereby preventing rapid fluctuations (which may be audible in the form of "pumping"). The compression may be implemented with a knee-curve to facilitate a smooth mapping between no-compression and compression, and may be applied on the input $x_{dB}(n)$ as follows:

$$\mathcal{G}_{dB}(n) = x_{dB}(n); \; x_{dB}(n) < T - (W/2) \quad \text{Equation (5)}$$

$$\mathcal{G}_{dB}(n) = x_{dB}(n) + ((1/CR) - 1)\frac{(x_{dB}(n) - T + (W/2))^2}{2W};$$

$$T + (W/2) \le x_{dB}(n) \le T - (W/2) \quad \text{Equation (6)}$$

$$\mathcal{G}_{dB}(n) = T + (x_{dB}(n) - T)/CR \quad \text{Equation (7)}$$

For Equation (5), $\mathcal{G}_{dB}(n)$ represents gain in dB, and $x_{dB}(n)$ represents the dB value of the input signal (20 log 10(x(n))), T represents the threshold, and W represents knee-width. For Equation (6), CR represents compression ratio.

Per Equation (5), the $\mathcal{G}_{dB}(n) = x_{dB}(n)$ for the range of $x_{dB}(n) < T - (W/2)$. Per Equation (6), $$\mathcal{G}_{dB}(n) = x_{dB}(n) + ((1/CR) - 1)\frac{(x_{dB}(n) - T + (W/2))^2}{2W}$$

for the range of $T+(W/2) \leq x_{dB}(n) \leq T-(W/2)$. Otherwise, per Equation (7), $\mathcal{G}_{dB}(n) = T + (x_{dB}(n) - T)/CR$.

Thus, per Equations (5) to (7), it is seen that the value of $\mathcal{G}_{dB}(n)$ varies with respect to the associated value of $x_{dB}(n)$.

Additionally, a make-up may be employed to bring the signal back up to 0 dB relative to full scale after compression.

Figure 11:
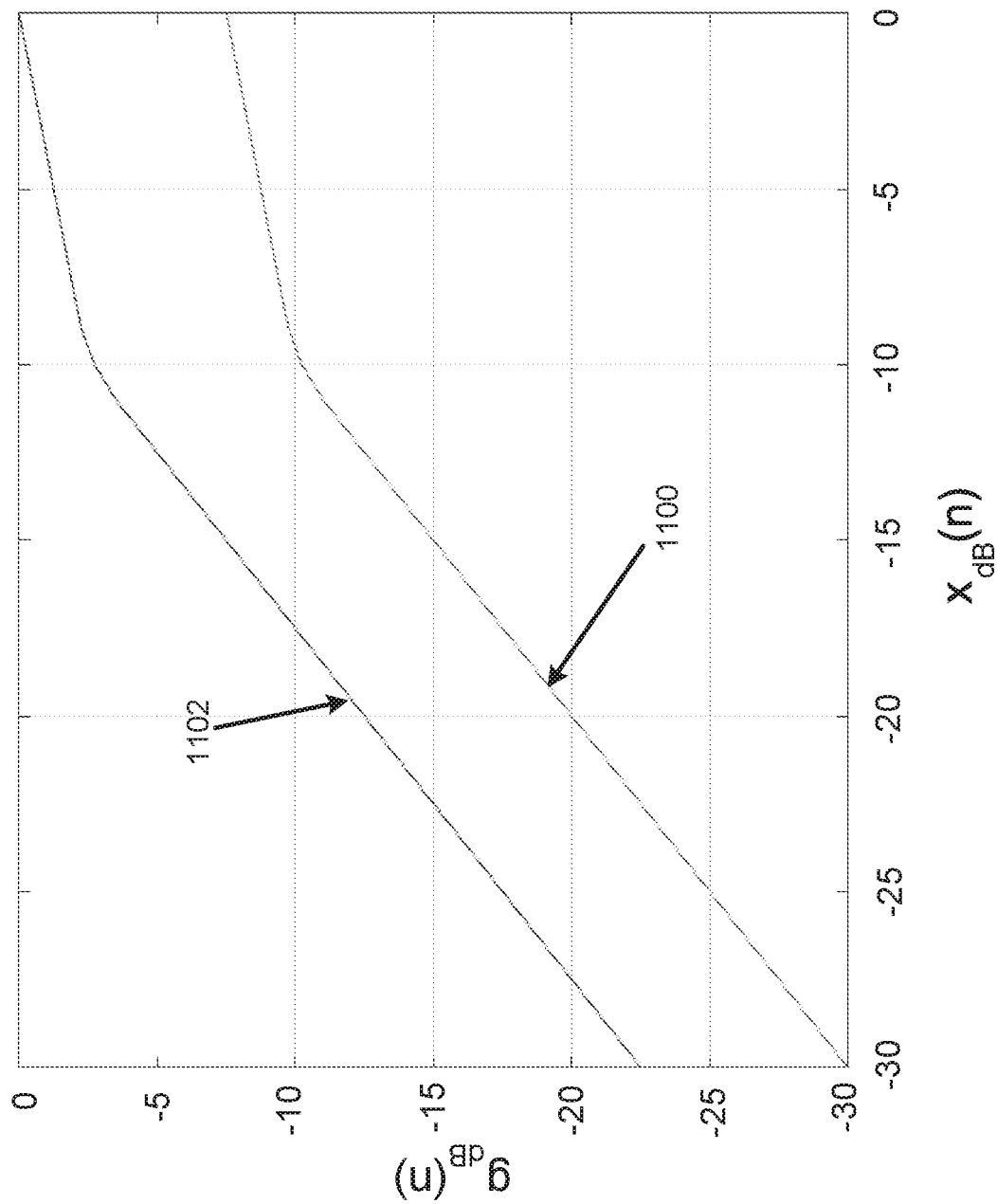
FIG. 11 illustrates a compression curve to illustrate operation of the loudness enhancement based on multiband range compression apparatus of FIG. 1.

FIG. 11 illustrates a compression curve to illustrate operation of the apparatus 100.

Referring to FIG. 11, the compression curve may include compression ratio (CR)=4, θ=−10, and W=2.5. Accordingly, for the input $x_{dB}(n)$, the corresponding output $y_{dB}(n)$ is shown at 1100, and the output $y_{dB}(n)$ per application of the corresponding values of $\mathcal{G}_{dB}(n)$ per Equations (5) to (7) is shown at 1102.

According to an example, the smoothing may be performed with a low-pass filter with a fast attack, and slow release time constants on the gain signal. The time constants may be tuned on various signals to ensure that the artifacts are non-audible. Alternatively, a machine learning technique may be utilized to adapt the time-constants to ensure that there are no artifacts on arbitrary signals. According to an example, compression processing may be eliminated in the 18-24 kHz band as this band is typically outside the hearing domain (viz., 20 Hz-20 kHz), and generally there are no signals that are reproduced at reasonably acceptable intensity for compression to be of benefit. Furthermore, transducers/loudspeakers may be highly directional and rolled off in this region. In this region, a delay of I=218 samples may be applied. Furthermore, even the 12-18 kHz band may be constrained to include this delay to reduce computational needs.

With respect to tuning the model of the multiband range compression 208, pink noise at reference level of −18 dBFS may be employed to determine the parameter set $\{\theta_{i,j}, CR_{i,j}\}$ where i={DC, 6, 12, 18} and j={6, 12, 18, 24}, sequential integer set. Pink noise may represent a standard in SOCIETY OF MOTION PICTURES AND TELEVISION ENGINEERS™ (SMPTE) standard for setting sound level SMPTE, as well as setting and measuring levels for calibrating home theater receivers. Furthermore, pink noise (which includes a 3 dB/octave roll-off) reasonably matches the spectrum of general music and speech-signals on a sufficiently long-duration window. Hence, pink noise may represent a stimuli to use for loudness/level measurement and calibration, and may be used for measuring audio output levels.

According to an example, level measurements may be performed with a sound pressure level (SPL) meter set at C-weighting and slow integration time. This technique may be applied to compute levels with a simulated SPL-meter. Alternatively, the ITU-R BS.1770-4 technique may be employed to estimate loudness.

Figure 12:
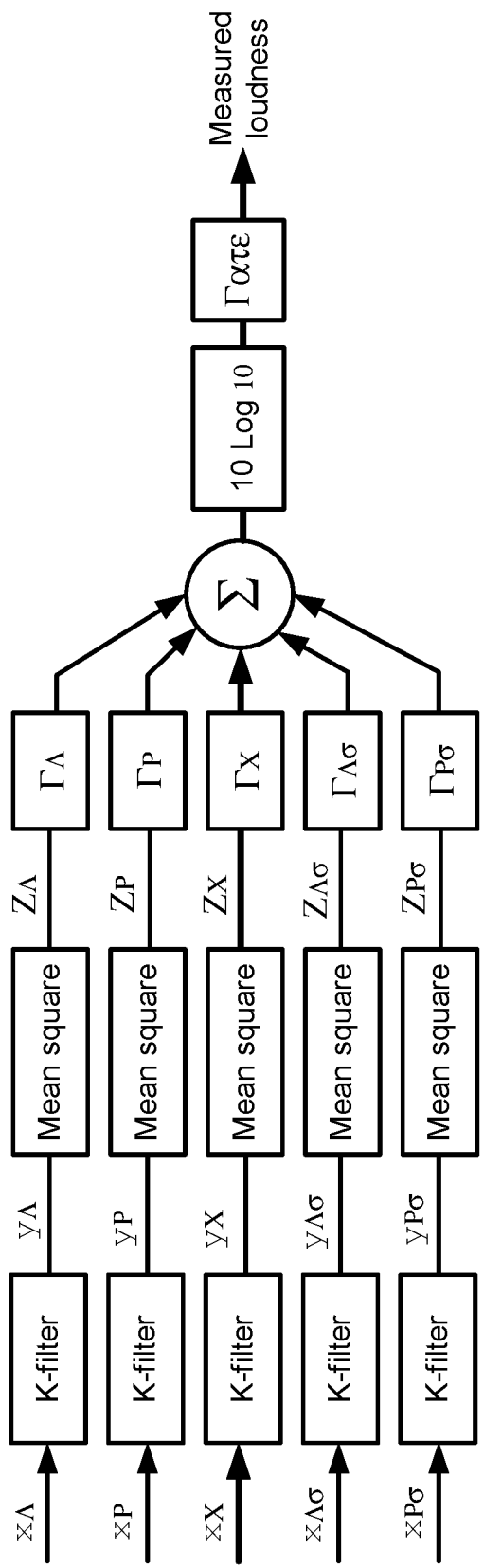
FIG. 12 illustrates an example block diagram of multichannel loudness.

FIG. 12 illustrates an example block diagram of multichannel loudness. Further, FIG. 13 illustrates a response of stage 1 of a K-weighting filter to account for the acoustic effects of the head.

Figure 13:
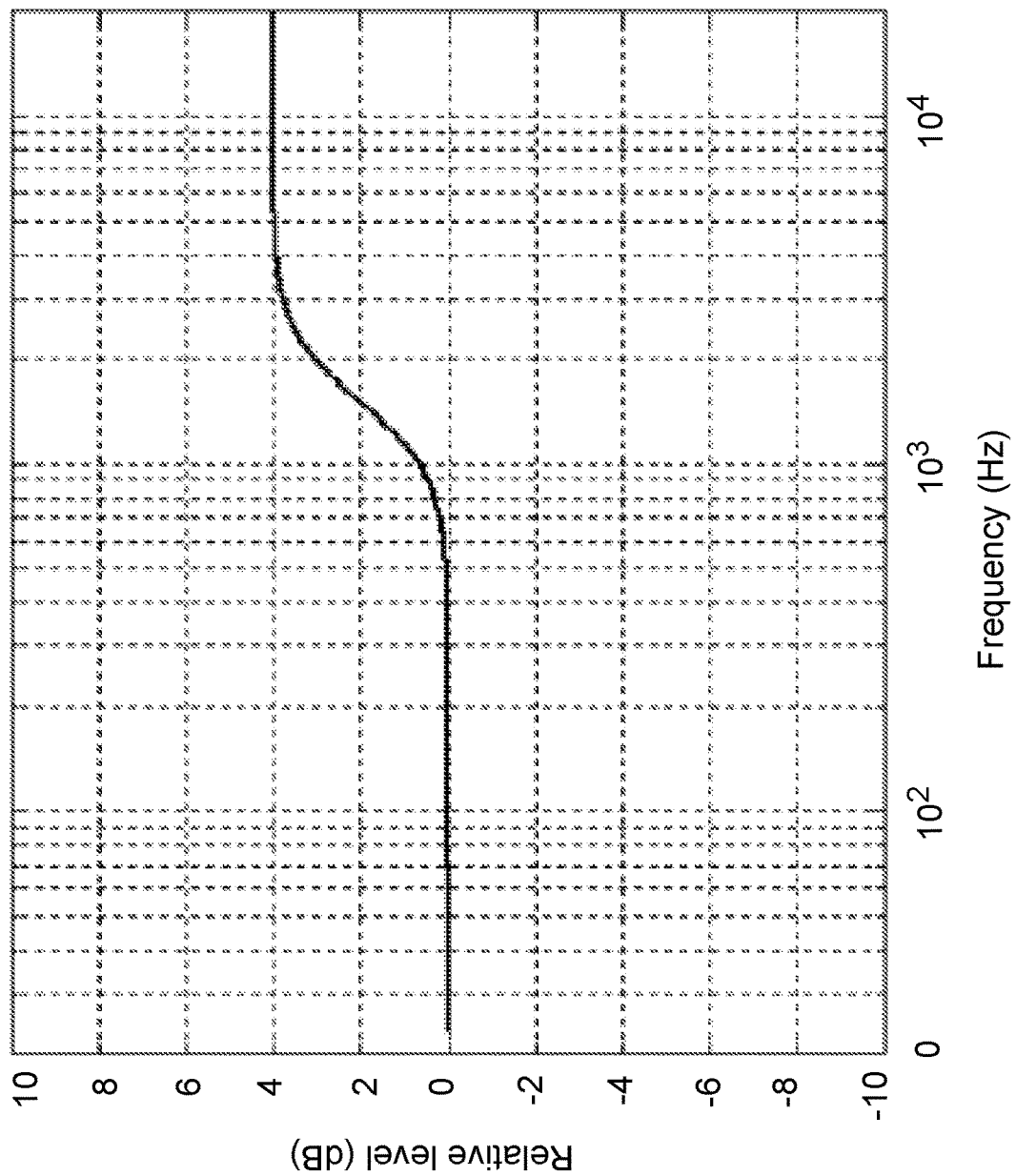
FIG. 13 illustrates a response of stage 1 of a K-weighting filter to account for the acoustic effects of the head.

Referring to FIG. 12, FIG. 12 illustrates the technique for computing loudness (dB Loudness, K-weighted, relative to Full Scale (LKFS) units), whereas FIG. 13 shows the pre-weighting filter. The filters of FIGS. 12 and 13 may be used to determine ITU loudness.

Figure 14:
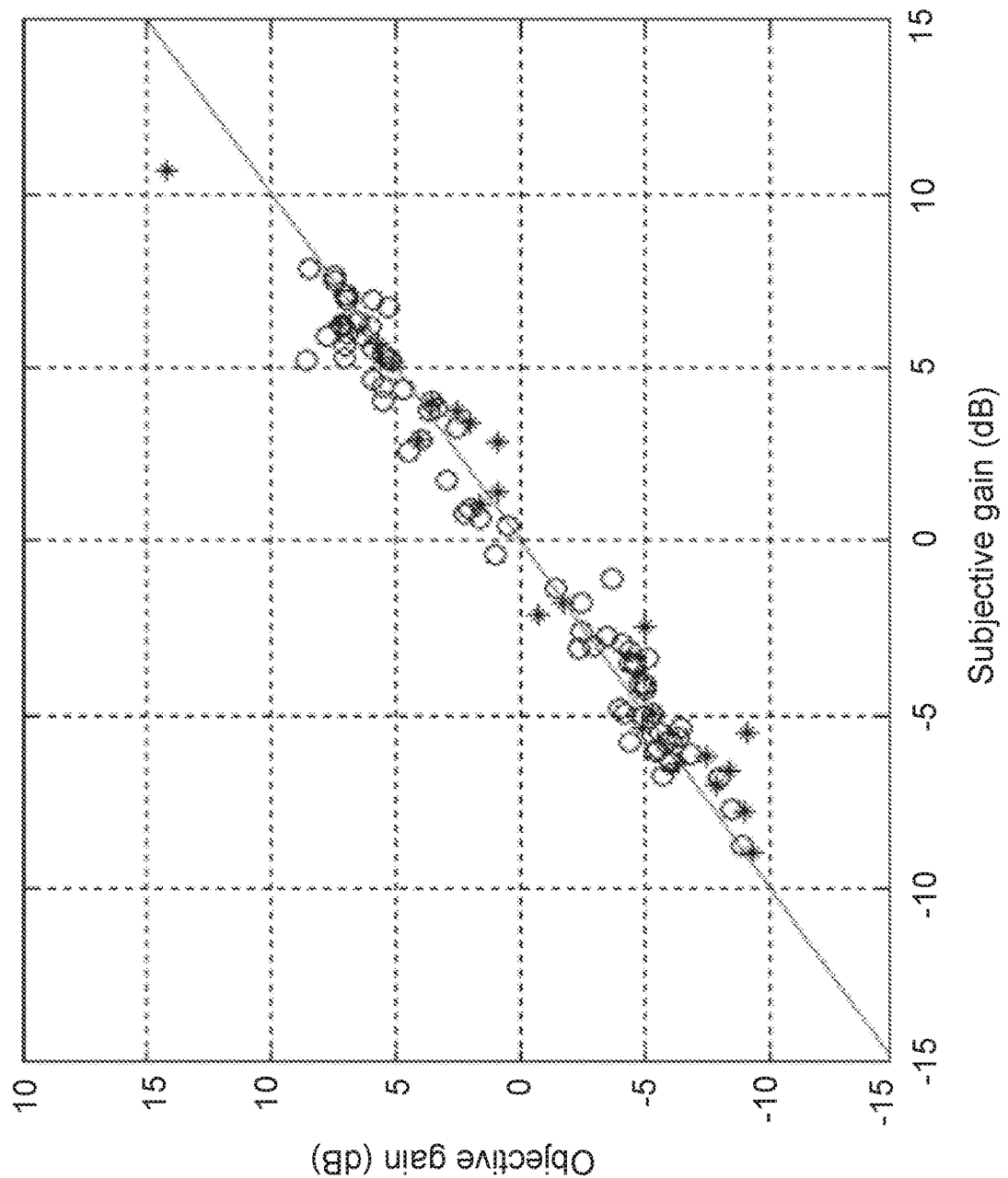
FIG. 14 illustrates correlation between subjective loudness and ITU measure.

FIG. 14 illustrates correlation between subjective loudness and ITU measure.

Referring to FIG. 14, FIG. 14 illustrates strong correlation between the loudness as computed using the ITU standard versus subjective data. The data for FIG. 14 represents use of standardized listening tests at various organizations including DOLBY™, Fraunhofer (FhG), NHK (Nippon Broadcasting), CRC (Canadian Research Center) and others.

FIG. 15 illustrates fifth-order fit to obtain ITU values for CR not in the integer set of {1,8}.

Referring to FIG. 15, as disclosed herein, the loudness variation determination module 102 may determine, based on variations in compression parameters 104 that include compression thresholds and compression ratios, corresponding variations in loudness levels for a specified loudness standard 106. For example, the specified loudness standard 106 may include the ITU-R BS.1770 standard for loudness.

With continued reference to FIG. 15, initial data for ITU loudness estimate using pink noise with the θ and CR parameters are shown in FIG. 15, for compression ratios CR={2, 4, 6, 8} and thresholds $\theta_{DC-6}$={−2, −4, −6, −8, −10, −12, −14} as an example for the DC-6 kHz band. The results in other bands are not shown in FIG. 15 as the trend is similar. The ITU level that is determined is relative to the level of the pink noise stimuli at −18 dBFS. Additional data-points for the ITU level outside the integer set of CR≠{1,2,4,6,8} dB, for a given threshold θ, may be interpolated and extrapolated by using a $5^{th}$ order fit, as this may provide a relatively small mean-square error to the data. This interpolation and extrapolation of ITU level for arbitrary CR's may be performed by first constructing the Vandermode matrix V and solving for the $5^{th}$ order approximation coefficients $p_k$ (k=1 ..., 5). The generalized Vandermode matrix V with input data $x_i$ (e.g., CR values for a given θ) may be expressed as follows:

$$V = \begin{pmatrix} 1 & x_1 & \ldots & x_1^k \\ 1 & x_2 & \ldots & x_2^k \\ \ldots & \ldots & \ldots \\ 1 & x_P & \ldots & x_P^k \end{pmatrix} \quad \text{Equation (7)}$$

For Equation (7), x represents data points, P represents the number of data points, and k represents the order of the polynomial.

The resulting ITU values for each CR may be embedded in the vector $\underline{y}=(y_j)(j=1, \ldots, 5)$, where $y_1=ITU_{CR=1}$, $y_2=ITU_{CR=2}, y_3=ITU_{CR=4}$, etc. and $x_1=1, x_2=2, x_3=4$ etc. The least-squares inversion for obtaining $\underline{p}=(p_0, p_2, \ldots, p_4)$ are $$\underline{p} = (V(1:5)^H V(1:5))^{-1} V(1:5)^H \underline{y} \quad \text{Equation (8)}$$

For Equation (8), $\underline{p}$ represents coefficients for the polynomial of order P, H represents the hermetian operator (complex conjugate and transpose), and $\underline{y}$ represents the vector of values mentioned above.

The results from the technique are shown in FIG. 15 for each θ, using the following polynomial equation:

$$ITU_x = \sum_{k=0}^{4} p_k x^k \quad \text{Equation (9)}$$

For Equation (9), $ITU_x$ represents the ITU level interpolated for compression ratio x. In this regard, the polyfit function in MATLAB™ may be used to generate the $p_k$ for Equation (9).

Thus, according to FIG. 15, ITU loudness may be correlated to compression ratio and compression threshold. For example, for compression ratio 5 and threshold −2 dB, the ITU loudness is approximately 1.1 dB LKFS. For compression ratio 6 and threshold −6 dB, the ITU loudness is 3.6 dB LKFS. In this manner, the ITU loudness correlated to compression ratio and compression threshold may be used by the learning model implementation module 108 to train the learning model 110 based on the variations in the compression parameters 104 and the corresponding variations in the loudness levels.

According to an example, with respect to determining the loudness for specific devices, the loudspeaker (or headphone) response may be accounted for in the ITU-R loudness computing stage that returns the various levels as a function of CR and θ, as the ITU standard assumes a flat magnitude response.

Referring to FIG. 1, with respect to calibration of the device 150, the parameters that may be provided to the multiband range compression 208 may include parameters such as the amount of desired loudness (in dBLKFS), the compression ratio, etc. In this regard, the corresponding θ threshold that would achieve this type of compression may be determined. A single hidden layer neural network model may be used to determine the corresponding θ threshold as an alternative to using a lookup table, which may be designed using another polynomial interpolation scheme.

FIG. 16 illustrates training results with two-input, single hidden layer with five neurons, and single output neuron.

Referring to FIG. 16, as disclosed herein, the learning model implementation module 108 may train the learning model 110 based on the variations in the compression parameters 104 and the corresponding variations in the loudness levels. Further, the compression parameters determination module 116 may determine, based on the trained learning model 110, the compression parameters 104 for the specified loudness level 114. In this regard, the trained learning model 110 may be used to determine, for example, the compression parameters 104 for the specified loudness level 114.

With continued reference to FIG. 16, FIG. 16 shows the training and validation results from using an input layer of dimension two (corresponding to the ITU level and CR parameter set), a single hidden layer with five neurons, and a single output neuron (corresponding to θ).

The single hidden layer neural network model may then be presented with data not trained. According to an example, the output reported by the single hidden layer neural network model may be θ=−11.73 dB as the threshold, with input being a compression ratio CR=4 and desired ITU loudness of 7 dB LKFS. According to another example, the output reported by the single hidden layer neural network model may be θ=−17.4 dB as the threshold, with input being a compression ratio CR=3 and desired ITU loudness of 9 dB LKFS.

Both of the aforementioned results of the single hidden layer neural network model are acceptable when viewed with respect to FIG. 16. For example, the threshold of −17.4 is well extrapolated, as the output from the ITU loudness based multi-band perfect reconstruction filterbank compression reported a value of 9.4 dB LKFS when using the predicted θ=−17.4 dB and CR=3 in the DC-6 kHz band.

Figure 17:
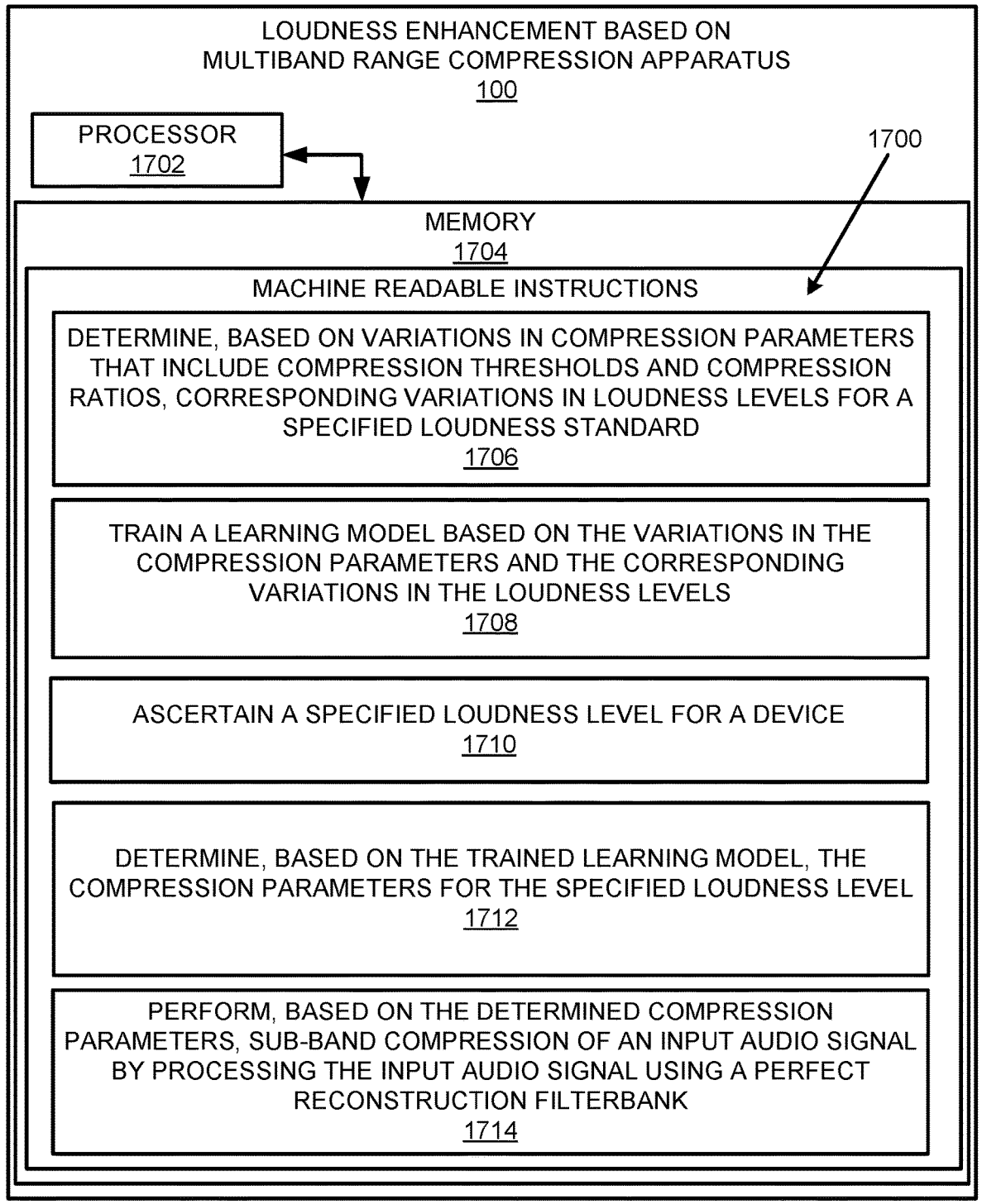
FIG. 17 illustrates an example block diagram for loudness enhancement based on multiband range compression.
Figure 19:
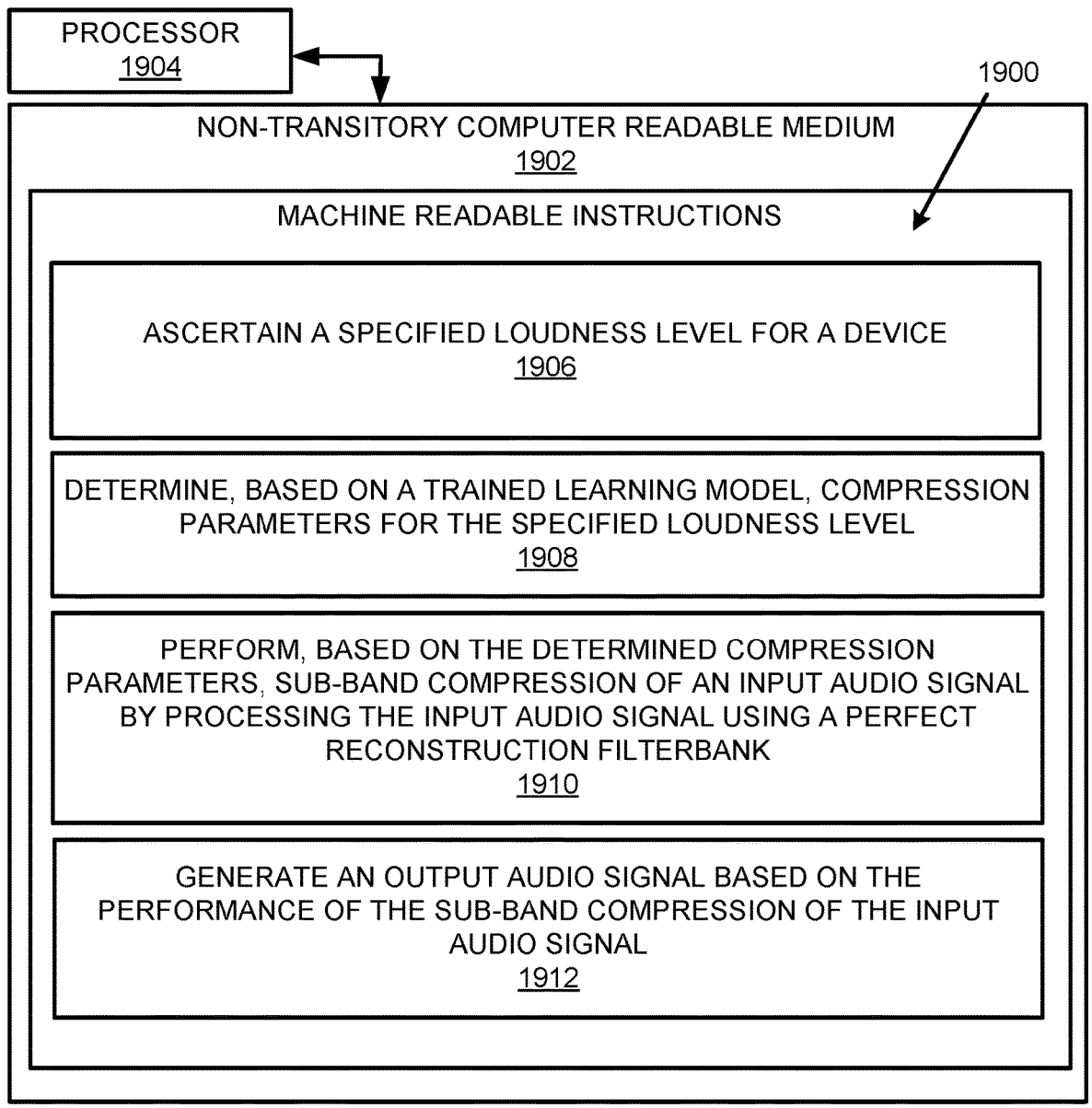
FIG. 19 illustrates a further example block diagram for loudness enhancement based on multiband range compression.

FIGS. 17-19 respectively illustrate an example block diagram 1700, an example flowchart of a method 1800, and a further example block diagram 1900 for loudness enhancement based on multiband range compression. The block diagram 1700, the method 1800, and the block diagram 1900 may be implemented on the apparatus 100 described above with reference to FIG. 1 by way of example and not limitation. The block diagram 1700, the method 1800, and the block diagram 1900 may be practiced in other apparatus. In addition to showing the block diagram 1700, FIG. 17 shows hardware of the apparatus 100 that may execute the instructions of the block diagram 1700. The hardware may include a processor 1702, and a memory 1704 (i.e., a non-transitory computer readable medium) storing machine readable instructions that when executed by the processor cause the processor to perform the instructions of the block diagram 1700. The memory 1704 may represent a non-transitory computer readable medium. FIG. 18 may represent a method for loudness enhancement based on multiband range compression, and the steps of the method. FIG. 19 may represent a non-transitory computer readable medium 1902 having stored thereon machine readable instructions to provide loudness enhancement based on multiband range compression. The machine readable instructions, when executed, cause a processor 1904 to perform the instructions of the block diagram 1900 also shown in FIG. 19.

The processor 1702 of FIG. 17 and/or the processor 1904 of FIG. 19 may include a single or multiple processors or other hardware processing circuit, to execute the methods, functions and other processes described herein. These methods, functions and other processes may be embodied as machine readable instructions stored on a computer readable medium, which may be non-transitory (e.g., the non-transitory computer readable medium 1902 of FIG. 19), such as hardware storage devices (e.g., RAM (random access memory), ROM (read only memory), EPROM (erasable, programmable ROM), EEPROM (electrically erasable, programmable ROM), hard drives, and flash memory). The memory 1704 may include a RAM, where the machine readable instructions and data for a processor may reside during runtime.

Referring to FIGS. 1-17, and particularly to the block diagram 1700 shown in FIG. 17, the memory 1704 may include instructions 1706 to determine, based on variations in compression parameters 104 that include compression thresholds and compression ratios, corresponding variations in loudness levels for a specified loudness standard 106.

The processor 1702 may fetch, decode, and execute the instructions 1708 to train a learning model 110 based on the variations in the compression parameters 104 and the corresponding variations in the loudness levels.

The processor 1702 may fetch, decode, and execute the instructions 1710 to ascertain a specified loudness level 114 for a device.

The processor 1702 may fetch, decode, and execute the instructions 1712 to determine, based on the trained learning model 110, the compression parameters 104 for the specified loudness level.

The processor 1702 may fetch, decode, and execute the instructions 1714 to perform, based on the determined compression parameters 104, sub-band compression of an input audio signal 120 by processing the input audio signal 120 using a perfect reconstruction filterbank 122.

Referring to FIGS. 1-16 and 18, and particularly FIG. 18, for the method 1800, at block 1802, the method may include ascertaining a specified loudness level 114 for a device.

At block 1804, the method may include determining, based on a trained learning model 110, compression parameters 104 for the specified loudness level 114. According to an example, the determined compression parameters 104 may include a compression threshold and a compression ratio, and the learning model 110 may be trained based on variations in a plurality of the compression parameters 104 and corresponding variations in loudness levels.

At block 1806, the method may include performing, based on the determined compression parameters 104, sub-band compression of an input audio signal 120 by processing the input audio signal 120 using a perfect reconstruction filterbank 122.

Referring to FIGS. 1-16 and 19, and particularly FIG. 19, for the block diagram 1900, the non-transitory computer readable medium 1902 may include instructions 1906 to ascertain a specified loudness level 114 for a device.

The processor 1904 may fetch, decode, and execute the instructions 1908 to determine, based on a trained learning model 110, compression parameters 104 for the specified loudness level. According to an example, the determined compression parameters 104 may include a compression threshold and a compression ratio, and the learning model 110 may be trained based on variations in a plurality of the compression parameters 104 and corresponding variations in loudness levels.

The processor 1904 may fetch, decode, and execute the instructions 1910 to perform, based on the determined compression parameters 104, sub-band compression of an input audio signal 120 by processing the input audio signal 120 using a perfect reconstruction filterbank 122.

The processor 1904 may fetch, decode, and execute the instructions 1912 to generate an output audio signal 124 based on the performance of the sub-band compression of the input audio signal 120.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. An apparatus comprising:
a processor; and
a non-transitory computer readable medium storing machine readable instructions that when executed by the processor cause the processor to:
determine, based on variations in compression parameters that include compression thresholds and compression ratios, corresponding variations in loudness levels for a specified loudness standard;
train a learning model based on the variations in the compression parameters and the corresponding variations in the loudness levels;
ascertain a specified loudness level for a device;
determine, based on the trained learning model, the compression parameters for the specified loudness level; and
perform, based on the determined compression parameters, sub-band compression of an input audio signal by processing the input audio signal using a perfect reconstruction filterbank and applying different gain values to corresponding bands of the input audio signal.

2. The apparatus according to claim 1, wherein
the perfect reconstruction filterbank includes a two-channel perfect reconstruction filterbank, and
the two-channel perfect reconstruction filterbank divides a band associated with the input audio signal in approximately one-half.

3. The apparatus according to claim 1, wherein
the perfect reconstruction filterbank includes a four-channel nested perfect reconstruction filterbank, and
the four-channel nested perfect reconstruction filterbank divides a band associated with the input audio signal in approximately four bands.

4. The apparatus according to claim 1, wherein the instructions are further to cause the processor to:
perform the sub-band compression of the input audio signal for a frequency range excluding approximately 18 kHz to approximately 24 kHz.

5. The apparatus according to claim 1, wherein the instructions are further to cause the processor to:
perform the sub-band compression of the input audio signal by applying
a first predetermined gain value of the gain values to a corresponding band of the input audio signal as a function of a compression threshold and a knee-width of the determined compression parameters for a first specified duration of the input audio signal, and
a second predetermined gain value of the gain values to the corresponding band of the input audio signal as a function of the compression threshold, a compression ratio of the determined compression parameters, and the knee-width for a second specified duration of the input audio signal.

6. The apparatus according to claim 1, wherein the instructions are further to cause the processor to:
perform smoothing on an output audio signal of the perfect reconstruction filterbank to reduce fluctuations within different bands associated with the output audio signal.

7. The apparatus according to claim 1, wherein the instructions are further to cause the processor to:
generate an output audio signal based on the performance of the sub-band compression of the input audio signal; and
apply the output audio signal to the device to generate the specified loudness level.

8. A method comprising:
ascertaining a specified loudness level for a device;
determining, based on a trained learning model, compression parameters for the specified loudness level, wherein
the determined compression parameters include a compression threshold and a compression ratio, and
the learning model is trained based on variations in a plurality of the compression parameters and corresponding variations in loudness levels; and
performing, based on the determined compression parameters, sub-band compression of an input audio signal by processing the input audio signal using a perfect reconstruction filterbank and applying different gain values to corresponding bands of the input audio signal.

9. The method according to claim 8, wherein
the perfect reconstruction filterbank includes a two-channel perfect reconstruction filterbank, and
the two-channel perfect reconstruction filterbank divides a band associated with the input audio signal in approximately one-half.

10. The method according to claim 8, wherein
the perfect reconstruction filterbank includes a four-channel nested perfect reconstruction filterbank, and
the four-channel nested perfect reconstruction filterbank divides a band associated with the input audio signal in approximately four bands.

11. The method according to claim 8, further comprising:
performing the sub-band compression of the input audio signal by applying
a first predetermined gain value of the gain values to a corresponding band of the input audio signal as a function of the compression threshold and a knee-width of the determined compression parameters for a first specified duration of the input audio signal, and
a second predetermined gain value of the gain values to the corresponding band of the input audio signal as a function of the compression threshold, the compression ratio, and the knee-width for a second specified duration of the input audio signal.

12. The method according to claim 8, further comprising:
generating an output audio signal based on the performance of the sub-band compression of the input audio signal; and
applying the output audio signal to the device to generate the specified loudness level.

13. A non-transitory computer readable medium having stored thereon machine readable instructions, the machine readable instructions, when executed, cause a processor to:
ascertain a specified loudness level for a device;
determine, based on a trained learning model, compression parameters for the specified loudness level, wherein
the determined compression parameters include a compression threshold and a compression ratio, and
the learning model is trained based on variations in a plurality of the compression parameters and corresponding variations in loudness levels;
perform, based on the determined compression parameters, sub-band compression of an input audio signal by processing the input audio signal using a perfect reconstruction filterbank and applying different gain values to corresponding bands of the input audio signal; and
generate an output audio signal based on the performance of the sub-band compression of the input audio signal.

14. The non-transitory computer readable medium according to claim 13, wherein the instructions are further to cause the processor to:
perform smoothing on the output audio signal of the perfect reconstruction filterbank to reduce fluctuations within different bands associated with the output audio signal.

15. The non-transitory computer readable medium according to claim 13, wherein the instructions are further to cause the processor to:
perform the sub-band compression of the input audio signal by applying
a first predetermined gain value of the gain values to a corresponding band of the input audio signal as a function of the compression threshold and a knee-width of the determined compression parameters for a first specified duration of the input audio signal, and
a second predetermined gain value of the gain values to the corresponding band of the input audio signal as a function of the compression threshold, the compression ratio, and the knee-width for a second specified duration of the input audio signal.

* * * * *